(12) United States Patent
Kawamura et al.

(10) Patent No.: US 8,582,068 B2
(45) Date of Patent: Nov. 12, 2013

(54) ACTIVE MATRIX SUBSTRATE WITH CONNECTIONS OF SWITCHING ELEMENTS AND INSPECTING WIRINGS, DISPLAY DEVICE, METHOD FOR INSPECTING ACTIVE MATRIX SUBSTRATE, AND METHOD FOR INSPECTING DISPLAY DEVICE

(75) Inventors: Takehiko Kawamura, Osaka (JP); Kazunori Tanimoto, Osaka (JP); Isao Ogasawara, Osaka (JP); Masahiro Yoshida, Osaka (JP); Hideaki Takizawa, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 308 days.

(21) Appl. No.: 12/934,896

(22) PCT Filed: Apr. 28, 2009

(86) PCT No.: PCT/JP2009/058317
§ 371 (c)(1),
(2), (4) Date: Sep. 27, 2010

(87) PCT Pub. No.: WO2009/139290
PCT Pub. Date: Nov. 19, 2009

(65) Prior Publication Data
US 2011/0018142 A1 Jan. 27, 2011

(30) Foreign Application Priority Data
May 16, 2008 (JP) .................................. 2008-129866

(51) Int. Cl.
*G02F 1/1345* (2006.01)
*G02F 1/136* (2006.01)
*G09G 3/36* (2006.01)
*H01L 29/04* (2006.01)

(52) U.S. Cl.
USPC ................. 349/149; 349/42; 349/43; 349/46; 349/151; 349/152; 345/92; 257/59; 257/72

(58) Field of Classification Search
USPC ......... 349/159, 151–152, 149, 42, 43, 46, 47; 345/92; 257/59, 72
See application file for complete search history.

(56) References Cited

U.S. PATENT DOCUMENTS 6,172,733 B1 * 1/2001 Hong et al. .................... 349/152
6,246,074 B1 * 6/2001 Kim et al. ....................... 257/48

(Continued)

FOREIGN PATENT DOCUMENTS

EP    2 264 689 A1   12/2010
JP    9-311341 A     12/1997

(Continued)

*Primary Examiner* — Hoan C Nguyen
(74) *Attorney, Agent, or Firm* — Birch, Stewart, Kolasch & Birch, LLP

(57) ABSTRACT

An active matrix substrate is provided with first inspection wirings (70, 75) capable of inputting inspection signals to first switching wirings that are not adjacent to each other among the first switching wirings (69, 74) and to second switching wirings that are not adjacent to each other among the second switching wirings (69, 74), and second inspection wirings (72, 77) capable of inputting inspection signals to first switching wirings that are not adjacent to each other and not connected to the first inspection wirings among the first switching wirings (69, 74) and to second switching wirings that are not adjacent to each other and not connected to the first inspection wirings among the second switching wirings (69, 74).

13 Claims, 8 Drawing Sheets

(56) References Cited

U.S. PATENT DOCUMENTS

| | | | |
|---|---|---|---|
| 6,310,667 B1 * | 10/2001 | Nakayoshi et al. | 349/42 |
| 6,710,839 B2 | 3/2004 | Komeno et al. | |
| 6,912,036 B2 | 6/2005 | Komeno et al. | |
| 7,002,658 B2 | 2/2006 | Komeno et al. | |
| 7,164,453 B2 | 1/2007 | Komeno et al. | |
| 7,471,349 B2 | 12/2008 | Komeno et al. | |
| 2003/0063248 A1 | 4/2003 | Komeno et al. | |
| 2004/0012744 A1 | 1/2004 | Ishige et al. | |
| 2004/0051836 A1 * | 3/2004 | Jung et al. | 349/149 |
| 2004/0141138 A1 | 7/2004 | Komeno et al. | |
| 2005/0225709 A1 | 10/2005 | Komeno et al. | |
| 2005/0231678 A1 | 10/2005 | Komeno et al. | |
| 2006/0138461 A1 | 6/2006 | Abe et al. | |
| 2006/0152642 A1 | 7/2006 | Komeno et al. | |
| 2007/0018680 A1 * | 1/2007 | Jeon et al. | 324/770 |
| 2009/0079889 A1 | 3/2009 | Komeno et al. | |
| 2010/0006838 A1 | 1/2010 | Yoshida et al. | |

FOREIGN PATENT DOCUMENTS

| | | |
|---|---|---|
| JP | 2002-98992 A | 4/2002 |
| JP | 2003-172944 A | 6/2003 |
| JP | 2003-241217 A | 8/2003 |
| JP | 2004-53702 A | 2/2004 |
| JP | 2004-110034 A | 4/2004 |
| JP | 2004-226931 A | 8/2004 |
| JP | 2004-325956 A | 11/2004 |
| JP | 2005-91962 A | 4/2005 |
| JP | 2005-241988 A | 9/2005 |
| JP | 2005-266529 A | 9/2005 |
| JP | 2005-301308 A | 10/2005 |
| RU | 2173909 C1 | 9/2001 |
| WO | WO 2005/029450 A1 | 3/2005 |
| WO | WO 2008/015808 A1 | 2/2008 |

* cited by examiner

ACTIVE MATRIX SUBSTRATE WITH CONNECTIONS OF SWITCHING ELEMENTS AND INSPECTING WIRINGS, DISPLAY DEVICE, METHOD FOR INSPECTING ACTIVE MATRIX SUBSTRATE, AND METHOD FOR INSPECTING DISPLAY DEVICE

TECHNICAL FIELD

The present invention relates to an active matrix substrate having two or more layers, with a plurality of first connecting wirings respectively connecting a plurality of first wirings formed parallel to each other in a display region and a plurality of first terminals arranged in a terminal arrangement region being formed on the respective layers, a display device, a method for inspecting the active matrix substrate, and a method for inspecting the display device.

BACKGROUND ART

In recent years, liquid crystal panels have been widely used in a variety of electronic devices such as mobile phones, PDAs, car navigation systems and personal computers. Liquid crystal panels are characterized by being thin, lightweight and power efficient. As for methods of mounting drivers on such liquid crystal panels, a so-called COG (Chip On Glass) method that involves directly mounting a driver on one (active matrix substrate) of a pair of substrates opposing each other across a liquid crystal material is known (e.g., see JP 2003-172944A, JP 2005-301308A, JP 2003-241217A, JP 2004-325956A, JP 2005-241988A, WO 2008/015808A). Using this COG method enables liquid crystal panels to be made thinner, smaller and lighter, and with higher definition between wirings and terminals.

Also, the vertical and horizontal pixel count of the display screens of liquid crystal panels used in compact electronic devices such as mobile phones and PDAs has transitioned in recent years from 160×120 QQVGA (Quarter Quarter Video Graphics Array) and 176×144 QCIF (Quarter Common Intermediate Format) to 320×240 QVGA (Quarter Video Graphics Array) and even 640×480 VGA (Video Graphics Array). This has lead to an increase in the number of wirings and terminals that ought to be formed on an active matrix substrate constituting a liquid crystal panel. However, in order to address the demand for more compact and higher definition liquid crystal panels, the size of the active matrix substrate cannot be increased.

In view of this, an active matrix substrate on which a plurality of connecting wirings respectively connecting a plurality of scan wirings formed in a display region and a plurality of scan terminals arranged in a terminal arrangement region are formed on two or more layers (multi-layers) is known (e.g., see JP 2004-53702A, JP 2005-91962A). Specifically, a prescribed number of the plurality of connecting wirings are formed on the same layer (first layer) as the layer on which the scan wirings are formed, and the remaining connecting wirings are formed on a different layer (second layer) from the layer on which the scan wirings are formed. Note that an insulating material is interposed between the connecting wirings formed on the first layer and the connecting wirings formed on the second layer. This enables a more compact and higher definition liquid crystal panel to be realized without increasing the size of the active matrix substrate, since the connecting wirings formed on the first layer and the connecting wirings formed on the second layer can be formed on the active matrix substrate so as to overlap each other.

DISCLOSURE OF THE INVENTION

Problem to be Solved by the Invention

Incidentally, because an insulating material is interposed between the connecting wirings formed on the first layer and the connecting wirings formed on the second layer, short circuits (leakage) are unlikely to occur between the connecting wirings formed on the first layer and the connecting wirings formed on the second layer. However, short circuits can occur between adjacent connecting wirings formed on the same layer, caused by dust in the photolithography process, etching residue or the like during manufacture of the active matrix substrate. In particular, in recent years, more compact and higher definition liquid crystal panels have been desired, as discussed above, increasing the likelihood of short circuits between adjacent connecting wirings formed on the same layer, since the spacing between wirings has been increasingly reduced in recent years. The importance of inspecting for short circuits between connecting wirings in the inspection process during manufacture or the like of active matrix substrates has thus increased. That is, in the mounting process, mounting a driver on a defective active matrix substrate in which a wiring short circuit has occurred results in a loss of material costs and operating costs.

However, despite the increasing importance of inspecting for short circuits between connecting wirings, a mechanism for detecting short circuits between adjacent connecting wirings formed on the same layer in relation to each of a plurality of layers in an active matrix substrate having two or more layers has not been established. In the abovementioned patent documents (e.g., see JP 2003-172944A, JP 2005-301308A, JP 2003-241217A, JP 2004-325956A, JP 2005-241988A, WO 2008/015808A, JP 2004-53702A, JP 2005-91962A), a configuration for detecting short circuits between adjacent connecting wirings formed on the same layer in relation to each of a plurality of layers in an active matrix substrate having two or more layers is not disclosed.

The present invention has been made in consideration of the above problems, and has as its object to provide an active matrix substrate, a display device, a method for inspecting the active matrix substrate and a method for inspecting the display device that enable short circuits between adjacent connecting wirings formed on the same layer to be reliably detected with a simple configuration in relation to each of a plurality of layers.

Means for Solving the Problem

In order to attain the above object, an active matrix substrate in the present invention includes a plurality of first wirings formed parallel to each other in a display region, a plurality of second wirings formed parallel to each other and so as to intersect the plurality of first wirings in the display region, a plurality of first terminals and a plurality of second terminals arranged in a terminal arrangement region, a plurality of first connecting wirings respectively connecting the plurality of first wirings and the plurality of first terminals, and a plurality of second connecting wirings respectively connecting the plurality of second wirings and the plurality of second terminals. The plurality of first connecting wirings include a plurality of third connecting wirings and a plurality of fourth connecting wirings, the third connecting wirings being formed on the same layer as the layer on which the first wirings are formed and at least a portion of the fourth wirings being formed on a different layer from the layer on which the first wirings are formed with an insulating material sandwiched therebetween, and the active matrix substrate includes a plurality of first switching elements respectively connected to the plurality of third connecting wirings, a plurality of second switching elements respectively connected to the plurality of fourth connecting wirings, a first common wiring connected to first switching elements that are not adjacent to each other among the plurality of first switching elements, and to second switching elements that are not adjacent to each other among the plurality of second switching elements, and a second common wiring connected to first switching elements that are not adjacent to each other and not connected to the first common wiring among the plurality of first switching elements, and to second switching elements that are not adjacent to each other and not connected to the first common wiring among the plurality of second switching elements.

According to the active matrix substrate of the present invention, inspection signals can be input to the third connecting wirings via the first switching elements by inputting mutually independent inspection signals to the first common wiring and the second common wiring while maintaining the first switching elements in an ON state, in an inspection process during manufacture or the like of the active matrix substrate. That is, mutually independent inspection signals can be input to adjacent third connecting wirings. Short circuits between adjacent third connecting wirings can thereby be detected. Note that the third connecting wirings are formed on the same layer as the layer on which the first wirings are formed.

Also, inspection signals can be input to the fourth connecting wirings via the second switching elements by inputting mutually independent inspection signals to the first common wiring and the second common wiring while maintaining the second switching elements in an ON state. That is, mutually independent inspection signals can be input to adjacent fourth connecting wirings. Short circuits between adjacent fourth connecting wirings can thereby be detected. Note that at least a portion of the fourth connecting wirings is formed on a different layer from the layer on which the first wirings are formed with an insulating material sandwiched therebetween.

Also, inspection wirings for inspecting for short circuits between adjacent third connecting wirings and inspection wirings for inspecting for short circuits between adjacent fourth connecting wirings are jointly the first common wiring and the second common wiring. The number of inspection wirings to be formed on an active matrix substrate can thus be reduced, in comparison with a mode in which inspection wirings for inspecting for short circuits between adjacent third connecting wirings and inspection wirings for inspecting for short circuits between adjacent fourth connecting wirings are respectively configured as discrete inspection wirings. Further, since the number of inspection wirings can be reduced, the system for inputting inspection signals can be reduced, and inspection can be implemented with a simple inspection device.

As a result, an active matrix substrate that enables short circuits between adjacent connecting wirings formed on the same layer to be reliably detected with a simple configuration in relation to each of a plurality of layers can be realized.

In order to attain the above object, a display device in the present invention is provided with an active matrix substrate according to the present invention. Note that the display device preferably is a liquid crystal display device.

In order to attain the above object, a method for inspecting an active matrix substrate or a display device in the present invention includes a process of inspecting the third connecting wirings by inputting mutually independent inspection signals to the first common wiring and the second common wiring while maintaining the first switching elements in an ON state, and a process of inspecting the fourth connecting wirings by inputting mutually independent inspection signals to the first common wiring and the second common wiring while maintaining the second switching elements in an ON state.

According to the method for inspecting an active matrix substrate or a display device of the present invention, short circuits of the third connecting wirings formed on the same layer as the layer on which the first wirings are formed can be detected, by inputting mutually independent inspection signals to the first common wiring and the second common wiring, while maintaining the first switching elements in an ON state. Also, short circuits of the fourth connecting wirings, at least a portion of which is formed on a different layer to the layer on which the first wirings are formed, can be detected, by inputting mutually independent inspection signals to the first common wiring and the second common wiring, while maintaining the second switching elements in an ON state. Note that the process of inspecting the third connecting wirings may be upstream or downstream of the process of inspecting the fourth connecting wirings.

Effects of the Invention

As described above, an active matrix substrate, a display device and a method for inspecting the active matrix substrate of the present invention accomplish the effect of enabling short circuits between adjacent connecting wirings formed on the same layer to be reliably detected with a simple configuration in relation to each of a plurality of layers.

BEST MODE FOR CARRYING OUT THE INVENTION

Figure 1:
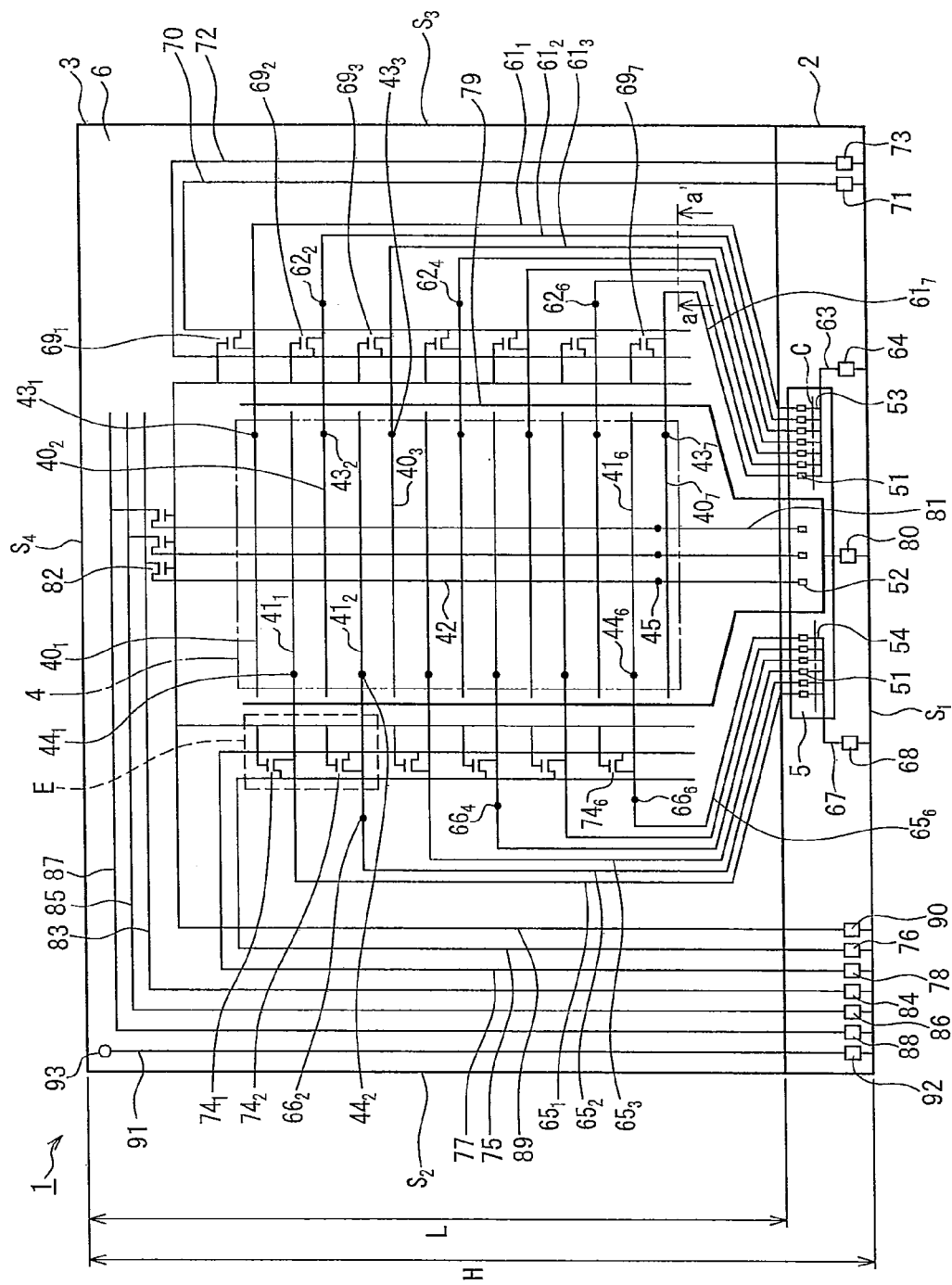
FIG. 1 is a plan view showing a schematic configuration of a liquid crystal panel according to an embodiment.

In an embodiment of the present invention, the plurality of first wirings preferably include a plurality of third wirings each having a signal input end at one end and a plurality of fourth wirings each having a signal input end at an opposite end, the third wirings and the fourth wirings being formed alternately in the display region, the plurality of third connecting wirings preferably include a plurality of fifth connecting wirings respectively connecting the plurality of first terminals and the input ends of third wirings that are not adjacent to each other among the plurality of third wirings and a plurality of sixth connecting wirings respectively connecting the plurality of first terminals and the input ends of fourth wirings that are not adjacent to each other among the plurality of fourth wirings, the plurality of fourth connecting wirings preferably include a plurality of seventh connecting wirings respectively connecting the plurality of first terminals and the input ends of third wirings that are not adjacent to each other and not connected to the fifth connecting wirings among the plurality of third wirings and a plurality of eighth connecting wirings respectively connecting the plurality of first terminals and the input ends of fourth wirings that are not adjacent to each other and not connected to the sixth connecting wirings among the plurality of fourth wirings, the first switching elements preferably include a plurality of third switching elements respectively connected to the plurality of fifth connecting wirings and a plurality of fourth switching elements respectively connected to the plurality of sixth connecting wirings, the second switching elements preferably include a plurality of fifth switching elements respectively connected to the plurality of seventh connecting wirings and a plurality of sixth switching elements respectively connected to the plurality of eighth connecting wirings, the first common wiring preferably includes a third common wiring connected to third switching elements that are not adjacent to each other among the plurality of third switching elements and to fifth switching elements that are not adjacent to each other among the plurality of fifth switching elements and a fourth common wiring connected to fourth switching elements that are not adjacent to each other among the plurality of fourth switching elements and to sixth switching elements that are not adjacent to each other among the plurality of sixth switching elements, and the second common wiring preferably includes a fifth common wiring connected to third switching elements that are not adjacent to each other and not connected to the third common wiring among the plurality of third switching elements and to fifth switching elements that are not adjacent to each other and not connected to the third common wiring among the plurality of fifth switching elements and a sixth common wiring connected to fourth switching elements that are not adjacent to each other and not connected to the fourth common wiring among the plurality of fourth switching elements and to sixth switching elements that are not adjacent to each other and not connected to the fourth common wiring among the plurality of sixth switching elements.

In the embodiment of the present invention, the plurality of third switching elements and the plurality of fifth switching elements preferably are formed in a peripheral wiring region in proximity to the input ends of the third wirings, and the plurality of fourth switching elements and the plurality of sixth switching elements preferably are formed in the peripheral wiring region in proximity to the input ends of the fourth wirings.

In the embodiment of the present invention, the third common wiring preferably is formed in the peripheral wiring region so as to intersect each of the plurality of fifth connecting wirings and each of the plurality of seventh connecting wirings, the fifth common wiring preferably is formed in the peripheral wiring region so as to intersect each of the plurality of fifth connecting wirings and each of the plurality of seventh connecting wirings, the fourth common wiring preferably is formed in the peripheral wiring region so as to intersect each of the plurality of sixth connecting wirings and each of the plurality of eighth connecting wirings, and the sixth common wiring preferably is formed in the peripheral wiring region so as to intersect each of the plurality of sixth connecting wirings and each of the plurality of eighth connecting wirings.

In the embodiment of the present invention, the third common wiring and the fifth common wiring preferably are adjacent to each other, the fourth common wiring and the sixth common wiring preferably are adjacent to each other, at least one of the plurality of third switching elements preferably is formed between the third common wiring and the fifth common wiring, at least one of the plurality of fifth switching elements preferably is formed between the third common wiring and the fifth common wiring, at least one of the plurality of fourth switching elements preferably is formed between the fourth common wiring and the sixth common wiring, and at least one of the plurality of sixth switching elements preferably is formed between the fourth common wiring and the sixth common wiring.

In the embodiment of the present invention, all of the plurality of third switching elements preferably are formed between the third common wiring and the fifth common wiring, all of the plurality of fifth switching elements preferably are formed between the third common wiring and the fifth common wiring, all of the plurality of fourth switching elements preferably are formed between the fourth common wiring and the sixth common wiring, and all of the plurality of sixth switching elements preferably are formed between the fourth common wiring and the sixth common wiring.

In the embodiment of the present invention, a first gate common wiring connected to a gate electrode of each third switching element and each fifth switching element preferably is formed between the third common wiring and the fifth common wiring, with the third switching elements being formed on either side sandwiching the first gate common wiring and the fifth switching elements being formed on either side sandwiching the first gate common wiring, and a second gate common wiring connected to a gate electrode of each fourth switching element and each sixth switching element preferably is formed between the fourth common wiring and the sixth common wiring, with the fourth switching elements being formed on either side sandwiching the second gate common wiring and the sixth switching elements being formed on either side sandwiching the second gate common wiring.

In the embodiment of the present invention, the active matrix substrate preferably further includes a plurality of first extension wirings individually extending from the plurality of first terminals respectively connected to the plurality of fifth connecting wirings and the plurality of first terminals respectively connected to the plurality of seventh connecting wirings, a seventh common wiring connected to each of the plurality of first extension wirings, a plurality of second extension wirings individually extending from the plurality of first terminals respectively connected to the plurality of sixth connecting wirings and the plurality of first terminals respectively connected to the plurality of eight connecting wirings, and an eighth common wiring connected to each of the plurality of second extension wirings.

In the embodiment of the present invention, the plurality of second wirings preferably each have a signal input end at one end, and the active matrix substrate preferably further includes a plurality of seventh switching elements connected to an opposite end of the second wirings, a ninth common wiring connected to seventh switching elements that are not adjacent to each other among the plurality of seventh switching elements, and a tenth common wiring connected to seventh switching elements that are not adjacent to each other and not connected to the ninth common wiring among the plurality of seventh switching elements.

In the embodiment of the present invention, the plurality of first wirings preferably include a first group of first wirings adjacent to each other and each having a signal input end at one end and a second group of first wirings adjacent to each other and each having a signal input end at an opposite end, and the plurality of first connecting wirings preferably respectively connect the plurality of first terminals and the input ends of the first group of first wirings and respectively connect the plurality of first terminals and the input ends of the second group of first wirings.

In the embodiment of the present invention, the first wirings preferably are scan wirings and the second wirings preferably are data wirings.

In the embodiment of the present invention, a method for inspecting an active matrix substrate according to the embodiment or a display device provided with an active matrix substrate according to the embodiment preferably includes a process of inspecting the fifth connecting wirings by inputting mutually independent inspection signals to the third common wiring and the fifth common wiring while maintaining the third switching elements in an ON state, a process of inspecting the seventh connecting wirings by inputting mutually independent inspection signals to the third common wiring and the fifth common wiring while maintaining the fifth switching elements in an ON state, a process of inspecting the sixth connecting wirings by inputting mutually independent inspection signals to the fourth common wiring and the sixth common wiring while maintaining the fourth switching elements in an ON state, and a process of inspecting the eighth connecting wirings by inputting mutually independent inspection signals to the fourth common wiring and the sixth common wiring while maintaining the sixth switching elements in an ON state.

In the embodiment of the present invention, a method for inspecting an active matrix substrate according to the embodiment or a display device provided with an active matrix substrate according to the embodiment preferably includes a process of inspecting the third wirings by inputting an inspection signal from the seventh common wiring, a process of inspecting the fourth wirings by inputting an inspection signal from the eighth common wiring, a process of cutting off the plurality of first extension wirings and the plurality of second extension wirings, a process of inspecting the fifth connecting wirings by inputting mutually independent inspection signals to the third common wiring and the fifth common wiring while maintaining the third switching elements in an ON state, a process of inspecting the seventh connecting wirings by inputting mutually independent inspection signals to the third common wiring and the fifth common wiring while maintaining the fifth switching elements in an ON state, a process of inspecting the sixth connecting wirings by inputting mutually independent inspection signals to the fourth common wiring and the sixth common wiring while maintaining the fourth switching elements in an ON state, and a process of inspecting the eighth connecting wirings by inputting mutually independent inspection signals to the fourth common wiring and the sixth common wiring while maintaining the sixth switching elements in an ON state.

In the embodiment of the present invention, a method for inspecting an active matrix substrate according to the embodiment or a display device provided with an active matrix substrate according to the embodiment preferably includes a process of inspecting the third wirings by inputting an inspection signal from the seventh common wiring, a process of inspecting the fourth wirings by inputting an inspection signal from the eighth common wiring, a process of inspecting the second wirings by inputting mutually independent inspection signals to the ninth common wiring and the tenth common wiring while maintaining the seventh switching elements in an ON state, a process of cutting off the plurality of first extension wirings and the plurality of second extension wirings, a process of inspecting the fifth connecting wirings by inputting mutually independent inspection signals to the third common wiring and the fifth common wiring while maintaining the third switching elements in an ON state, a process of inspecting the seventh connecting wirings by inputting mutually independent inspection signals to the third common wiring and the fifth common wiring while maintaining the fifth switching elements in an ON state, a process of inspecting the sixth connecting wirings by inputting mutually independent inspection signals to the fourth common wiring and the sixth common wiring while maintaining the fourth switching elements in an ON state, and a process of inspecting the eighth connecting wirings by inputting mutually independent inspection signals to the fourth common wiring and the sixth common wiring while maintaining the sixth switching elements in an ON state.

Hereinafter, an embodiment of the present invention will be described with reference to the drawings.

In the drawings referred to hereinafter, however, for ease of description only the principal members required in order to describe the present invention are shown in simplified form, among the constituent members of the embodiment of the present invention. Accordingly, an active matrix substrate according to the present invention can be provided with arbitrary constituent members that are not shown in the drawings referred to in the present specification. Also, the dimensions in the drawings are not intended to faithfully represent the actual dimensions of the constituent members or the dimensional proportions of the members.

The above first to tenth common wirings will be described in the present embodiment as first to tenth inspection wirings. Further, the above first and second gate common wirings will be described in the present embodiment as first and second control wirings.

FIG. 1 is a plan view showing a schematic configuration of a liquid crystal panel 1 according to the present embodiment. As shown in FIG. 1, the liquid crystal panel 1 is provided with an active matrix substrate 2 and an opposing substrate 3 that opposes the active matrix substrate 2. A liquid crystal material (not shown) is sandwiched and held between the active matrix substrate 2 and the opposing substrate 3. Note that a color filter layer that includes R (red), G (green) and B (blue) color filters and a black matrix that prevents light from leaking between these color filters is formed on the opposing substrate 3 according to the present embodiment. Common electrodes are formed on the color filter layer.

Here, the liquid crystal panel 1 according to the present embodiment is employed in an electronic device for mobile terminals such as a mobile phone, a PDA (Personal Digital Assistant), a PHS (Personal Handy-phone System) or an HHT (Hand-Held Terminal), for example. Apart from an electronic device for mobile terminals, the liquid crystal panel 1 according to the present embodiment is also employed in an electronic device such as a game terminal, a car navigation system, a personal computer, a television, a video camera or a digital camera. Here, an electronic device provided with the liquid crystal panel 1 is an embodiment of a liquid crystal display device according to the present invention. Note that the active matrix substrate 2 according to the present embodiment may be provided in a panel (display device) other than the liquid crystal panel 1, such as a field emission display, a plasma display or an organic EL display.

The active matrix substrate 2 has a display region 4, a terminal arrangement region 5, and a peripheral wiring region 6 that is outside of the display region 4 and surrounds the display region 4. Note that, hereinafter, one side of the liquid crystal panel 1 will be denoted as a first side $S_1$ (lower side in FIG. 1), the sides on the left and right sandwiching this first side $S_1$ will be denoted respectively as a second side $S_2$ and a third side $S_3$, and the side opposing the first side $S_1$ will be denoted as a fourth side $S_4$.

Here, as shown in FIG. 1, a length H of the second side $S_2$ (third side $S_3$) of the active matrix substrate 2 is longer than a length L of the second side $S_2$ (third side $S_3$) of the opposing substrate 3. In the case where the active matrix substrate 2 and the opposing substrate 3 are adhered together via the liquid crystal material (not shown), the terminal arrangement region 5 of the active matrix substrate 2 will be positioned closer to first side $S_1$ than is the opposing substrate 3.

First scan wirings (first wirings, third wirings) $40_1$ to $40_7$, second scan wirings (first wirings, fourth wirings) $41_1$ to $41_6$, and data wirings (second wirings) $42_1, 42_2, 42_3, \ldots 42_i$ are formed in the display region 4. Here, the first scan wirings $40_1$ to $40_7$ respectively have input ends $43_1$ to $43_7$ for scan signals at one end. Also, the second scan wirings $41_1$ to $41_6$ respectively have input ends $44_1$ to $44_6$ for scan signals at an opposite end. Further, the data wirings $42_1, 42_2, 42_3, \ldots 42_i$ respectively have input ends $45_1, 45_2, 45_3, \ldots 45_i$ for data signals at one end. Note that in FIG. 1, the data wirings $42_1, 42_2, 42_3, \ldots 42_i$ are denoted simply as 42, and the input ends $45_1, 45_2, 45_3, \ldots 45_i$ are denoted simply as 45.

In FIG. 1, for ease of description, seven first scan wirings $40_1$ to $40_7$ and six second scan wirings $41_1$ to $41_6$ are shown, but the number of first scan wirings and second scan wirings to be formed in the display region 4 is actually greater than this. The number of first scan wirings and second scan wirings is arbitrary and is not particularly limited here.

Note that, hereinafter, only in the case where individual wirings and switching elements need to be distinguished will description be given with the subscripts for distinguishing individual wirings and switching elements attached, such as data wiring $42_1$, for example, and in the case where individual wirings and switching elements do not particularly need to be distinguished or in the case where the wirings and switching elements are referred to collectively, description will be given without attaching the subscripts, such as data wirings 42, for example. Also, hereinafter, in cases where the first scan wirings $40_1$ to $40_7$ and the second scan wirings $41_1$ to $41_6$ do not need to be distinguished or are referred to collectively, description will refer simply to scan wirings 40 and 41.

Here, in the present embodiment, the first scan wirings $40_1$ to $40_7$ and the second scan wirings $41_1$ to $41_6$ are formed in the display region 4 alternately per wiring and so as to be parallel to each other. That is, the scan wirings 40 and 41 are formed in the display region 4 so as to be arranged from the fourth side $S_4$ toward the first side $S_1$ as follows: first scan wiring $40_1$, second scan wiring $41_1$, first scan wiring $40_2$, second scan wiring $41_2$, first scan wiring $40_3$, second scan wiring $41_3$, and so on. Also, the data wirings $42_1, 42_2, 42_3, \ldots 42_i$ are formed in the display region 4 parallel to each other and so as to intersect the scan wirings 40 and 41. In the present embodiment, the data wirings 42 are formed in the display region 4 per RGB. In other words, data wirings 42 for R, data wirings 42 for G and data wirings 42 for B are formed in the display region 4. In the case of a monochrome liquid crystal panel 1, however, the present invention is not limited thereto. Further, apart from the scan wirings 40 and 41 and the data wirings 42, storage capacitor wirings (not shown) are formed in the display region 4. The storage capacitor wirings are formed in the display region 4 so as to be parallel to the scan wirings 40 and 41.

Note that switching elements such as TFTs (Thin Film Transistors) or MIM (Metal Insulator Metal) (not shown) and picture element electrodes (R, G or B) (not shown) connected to these switching elements are formed at the intersecting portions of the scan wirings 40 and 41 and the data wirings 42.

The terminal arrangement region 5 is a region in which a plurality of scan terminals (first terminals) 51 and a plurality of data terminals (second terminals) 52 are arranged on the active matrix substrate 2. A driver or a flexible wiring substrate provided with a diver is electrically connected to the scan terminals 51 and the data terminals 52 in the terminal arrangement region 5. The scan terminals 51 are thus terminals to which scan signals can be input from the driver. Also, the data terminals 52 are terminals to which data signals can be input from the driver. Note that the driver can be connected in the terminal arrangement region 5 with a COG (Chip on Glass) method. Also, a flexible wiring substrate provided with a driver can be connected in the terminal arrangement region 5 with a TCP (Tape Carrier Package) method. Note that the connection method is not particularly limited here.

Note that FIG. 1 shows an example in which a single driver can be disposed, but the present invention is not limited thereto. For example, by providing a plurality of terminal arrangement regions 5 on the active matrix substrate 2, a configuration may be adopted in which a plurality of drivers can be respectively disposed in the plurality of terminal arrangement regions 5.

Right-side scan connecting wirings (first connecting wirings) $61_1$ to $61_7$ respectively connecting the scan terminals 51 and the input ends $43_1$ to $43_7$ for scan signals provided at one end of the first scan wirings $40_1$ to $40_7$ are formed in the peripheral wiring region 6. That is, the right-side scan connecting wirings $61_1$ to $61_7$ are extracted from the input ends $43_1$ to $43_7$ for scan signals toward the third side $S_3$, formed in the peripheral wiring region 6 along the third side $S_3$, and connected to the scan terminals 51.

Here, the right-side scan connecting wirings $61_1$ to $61_7$ include first right-side scan connecting wirings (third connecting wirings, fifth connecting wirings) $61_1, 61_3, 61_5$ and $61_7$ and second right-side scan connecting wirings (fourth connecting wirings, seventh connecting wirings) $61_2, 61_4$ and $61_6$. The first right-side scan connecting wirings $61_1, 61_3, 61_5$ and $61_7$ are wirings formed on the same layer as the layer on which the scan wirings 40 and 41 are formed. Note that, hereinafter, the layer on which the scan wirings 40 and 41 are formed will be referred to as a "first layer". The second right-side scan connecting wirings $61_2, 61_4$ and $61_6$ are wirings of which at least a portion thereof is formed on a different layer from the layer (first layer) on which the first scan wirings $40_1$ to $40_7$ are formed with an insulating material sandwiched therebetween. Note that, hereinafter, the different layer from the layer on which the scan wirings 40 and 41 are formed will be referred to as a "second layer". In other words, the data wirings 42 are formed on the second layer.

Here, the second right-side scan connecting wirings $61_2, 61_4$ and $61_6$ respectively have connecting portions $62_2, 62_4$ and $62_6$. In the present embodiment, portions of the second right-side scan connecting wirings $61_2, 61_4$ and $61_6$ between the connecting portions $62_2, 62_4$ and $62_6$ and the input ends $43_2, 43_4$ and $43_6$ of the first scan wirings $40_2, 40_4$ and $40_6$ are formed on the first layer, and portions between the scan terminals 51 and the connecting portions $62_2$, $62_4$ and $62_6$ are formed on the second layer. That is, the wirings formed on the first layer are electrically connected at the connecting portions $62_2$, $62_4$ and $62_6$ to the wirings formed on the second layer. Note that as for the method for electrically connecting the wirings, the wirings formed on the first layer and the wirings formed on the second layer may be brought into direct contact via contact holes formed in the insulating material, or the wirings formed on the first layer and the wirings formed on the second layer may be electrically connected via electrodes further formed on a separate layer. That is, as far as the method for electrically connecting the wirings is concerned, various arbitrary methods can be used, with the method not being particularly limited here. Also, the positions of the connecting portions $62_2$, $62_4$ and $62_6$ are arbitrary and not intended to be limited to the positions shown in FIG. 1.

Figure 2:
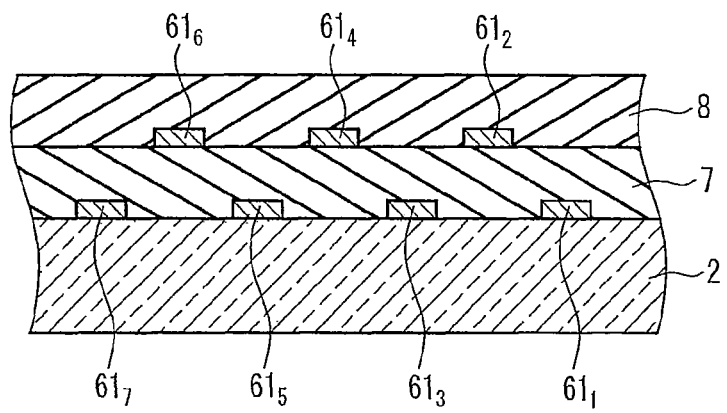
FIG. 2 is a cross-sectional view sectioned along a section line a-a' shown in FIG. 1.

FIG. 2 is a cross-sectional view sectioned along a section line a-a' shown in FIG. 1. As shown in FIG. 2, the first right-side scan connecting wirings $61_1$, $61_3$, $61_5$ and $61_7$ are formed as a first layer on the active matrix substrate 2. An insulating film (insulating material) 7 is formed on the active matrix substrate 2, so as to cover the first right-side scan connecting wirings $61_1$, $61_3$, $61_5$ and $61_7$. Also, the second right-side scan connecting wirings $61_2$, $61_4$ and $61_6$ are formed as a second layer on the insulating film 7. Further, a protective film 8 is formed on the insulating film 7, so as to cover the second right-side scan connecting wirings $61_2$, $61_4$ and $61_6$. That is, the insulating film 7 is interposed between the first right-side scan connecting wirings $61_1$, $61_3$, $61_5$ and $61_7$ and the second right-side scan connecting wirings $61_2$, $61_4$ and $61_6$.

Thus, in the present embodiment, the first right-side scan connecting wirings $61_1$, $61_3$, $61_5$ and $61_7$ are formed on the first layer, and at least a portion of the second right-side scan connecting wirings $61_2$, $61_4$ and $61_6$ is formed on the second layer. A more compact and higher definition active matrix substrate can thus be realized in comparison with a mode in which all of the right-side scan connecting wirings $61_1$ to $61_7$ are formed on a single layer.

Figure 3:
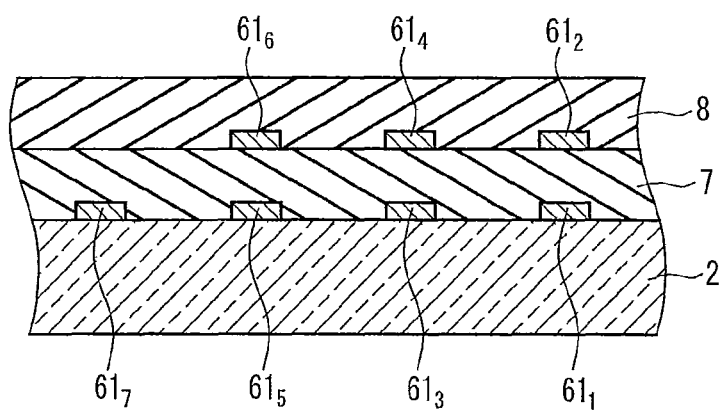
FIG. 3 is a cross-sectional view showing a schematic configuration of another liquid crystal panel according to the embodiment at the same location as that shown in FIG. 2.

Note that in the above, an example was described in which the right-side scan connecting wirings $61_1$ to $61_7$ are formed on the first layer and the second layer in the stated order from the third side $S_3$ toward the second side $S_2$ at the location of the section line a-a' shown in FIG. 1, but the present invention is not limited thereto. For example, as shown in FIG. 3, the right-side scan connecting wirings may be formed on the first layer and the second layer such that the first right-side scan connecting wirings $61_1$ and the second right-side scan connecting wirings $61_2$ overlap each other, the first right-side scan connecting wirings $61_3$ and the second right-side scan connecting wirings $61_4$ overlap each other, and the first right-side scan connecting wirings $61_5$ and the second right-side scan connecting wirings $61_6$ overlap each other. In this case, an even more compact and higher definition active matrix substrate 2 can be realized in comparison with the mode shown in FIG. 2.

Returning to FIG. 1, a plurality of first extension wirings 53 respectively extending toward the first side S1 from the plurality of scan terminals 51 connected to the right-side scan connecting wirings $61_1$ to $61_7$ are connected to the plurality of the scan terminals 51. Also, a seventh inspection wiring 63 for scan wirings is connected to the plurality of first extension wirings 53. That is, the seventh inspection wiring 63 for scan wirings is connected to each of the plurality of first extension wirings 53. Also, a first inspection pad 64 for scan wirings is further connected to the seventh inspection wiring 63 for scan wirings. The first inspection pad 64 for scan wirings is a pad through which scan inspection signals can be input. Note that scan inspection signals are inspection signals that functions as scan signals.

In the present embodiment, because the first inspection wiring 63 for scan wirings is connected to each of the plurality of first extension wirings 53, scan inspection signals can be collectively input to the first scan wirings $40_1$ to $40_7$ from the first inspection pad 64 for scan wirings. Also, because the first inspection wiring 63 for scan wirings is connected to each of the plurality of first extension wirings 53, static electricity generated in the active matrix substrate 2 can be eliminated or dispersed from the first inspection wiring 63 for scan wirings and the first inspection pad 64 for scan wirings. Because static electricity generated in the active matrix substrate 2 can be eliminated or dispersed, short circuit or disconnection due to static electricity, as well as changes in TFT or MIM characteristics and the like can be suppressed.

Also, left-side scan connecting wirings (first connecting wirings) $65_1$ to $65_6$ respectively connecting the scan terminals 51 and the input ends $44_1$ to $44_6$ for scan signals provided at the opposite end of the second scan wirings $41_1$ to $41_6$ are formed in the peripheral wiring region 6. That is, the left-side scan connecting wirings $65_1$ to $65_6$ are extracted from the input ends $44_1$ to $44_6$ for scan signals toward the second side $S_2$, formed in the peripheral wiring region 6 along the second side $S_2$, and connected to the scan terminals 51.

Here, the left-side scan connecting wirings $65_1$ to $65_6$ include first left-side scan connecting wirings (third connecting wirings, sixth connecting wirings) $65_1$, $65_3$ and $65_5$, and second left-side scan connecting wirings (fourth connecting wirings, eighth connecting wirings) $65_2$, $65_4$ and $65_6$. The first left-side scan connecting wirings $65_1$, $65_3$ and $65_5$ are wirings that are formed on the first layer. The second left-side scan connecting wirings $65_2$, $65_4$ and $65_6$ are wirings of which at least a portion is formed on the second layer.

Here, the second left-side scan connecting wirings $65_2$, $65_4$ and $65_6$ respectively have connecting portions $66_2$, $66_4$ and $66_6$, similarly to the second right-side scan connecting wirings $61_2$, $61_4$ and $61_6$. In the present embodiment, portions of the second left-side scan connecting wirings $65_2$, $65_4$ and $65_6$ between the connecting portions $66_2$, $66_4$ and $66_6$ and the input ends $44_2$, $44_4$ and $44_6$ of the second scan wirings $41_2$, $41_4$ and $41_6$ are formed on the first layer, and portions between the connecting portions $66_2$, $66_4$ and $66_6$ and the scan terminals 51 are formed on the second layer. That is, wirings formed on the first layer are electrically connected at the connecting portions $66_2$, $66_4$ and $66_6$ to wirings formed on the second layer. Note that the method for electrically connecting the wirings is arbitrary, and the positions of the connecting portions $66_2$, $66_4$ and $66_6$ are also not particularly limited, similarly to the configuration described for the second right-side scan connecting wirings $61_2$, $61_4$ and $61_6$.

A plurality of second extension wirings 54 respectively extending from the plurality of the scan terminals 51 connected to the left-side scan connecting wirings 64 toward the first side S1 are connected to the plurality of the scan terminals 51. Also, a eighth inspection wiring 67 for scan wirings is connected to the plurality of second extension wirings 54. That is, the eighth inspection wiring 67 for scan wirings is connected to each of the plurality of second extension wirings 54. Also, a second inspection pad 68 for scan wirings is further connected to the eighth inspection wiring 67 for scan wirings. The second inspection pad 68 for scan wirings is a pad through which scan inspection signals can be input.

In the present embodiment, because the second inspection wiring 67 for scan wirings is connected to each of the plurality of second extension wirings 54, scan inspection signals can be collectively input to the second scan wirings $41_1$ to $41_6$ from the second inspection pad 68 for scan wirings. Also, because the second inspection wiring 67 for scan wirings is connected to each of the plurality of second extension wirings 54, static electricity generated in the active matrix substrate 2 can be eliminated or dispersed from the second inspection wiring 67 for scan wirings and the second inspection pad 68 for scan wirings.

Also, right-side scan switching elements $69_1$ to $69_7$ respectively connected to the right-side scan connecting wirings $61_1$ to $61_7$ are formed in the peripheral wiring region 6. Specifically, the right-side scan switching elements $69_1$ to $69_7$ are formed in the peripheral wiring region 6 in proximity to the input ends $43_1$ to $43_7$ for scan signals. Here, the right-side scan switching elements $69_1$ to $69_7$ include first right-side scan switching elements (first switching elements, third switching elements) $69_1$, $69_3$, $69_5$ and $69_7$ respectively connected to the first right-side scan connecting wirings $61_1$, $61_3$, $61_5$ and $61_7$ and second right-side scan switching elements (second switching elements, fifth switching elements) $69_2$, $69_4$ and $69_6$ respectively connected to the second right-side scan connecting wirings $61_2$, $61_4$ and $61_6$.

Here, a first inspection wiring (first inspection wiring, third inspection wiring) 70 for right-side scan connecting wirings is further connected to the first right-side scan switching element $69_1$, the second right-side scan switching element $69_4$ and the first right-side scan switching element $69_5$. That is, the first inspection wiring 70 for right-side scan connecting wirings is an inspection wiring capable of inputting scan inspection signals to the non-adjacent first light-side scan switching elements $69_1$ and $69_5$ among the first right-side scan switching elements $69_1$, $69_3$, $69_5$ and $69_7$, and to the non-adjacent second right-side scan switching element $69_4$ among the second right-side scan switching elements $69_2$, $69_4$ and $69_6$. Note that the first inspection wiring 70 for right-side scan connecting wirings is formed in the peripheral wiring region 6 so as to intersect each of the right-side scan connecting wirings $61_1$ to $61_7$.

Also, a first inspection pad 71 for right-side scan connecting wirings is further connected to the first inspection wiring 70 for right-side scan connecting wirings. The first inspection pad 71 for right-side scan connecting wirings is a pad through which scan inspection signals can be input. Scan inspection signals can thereby be input to the first right-side scan connecting wirings $61_1$, the second right-side scan connecting wirings $61_4$ and the first right-side scan connecting wirings $61_5$ from the first inspection pad 71 for right-side scan connecting wirings.

Also, a second inspection wiring (second inspection wiring, fifth inspection wiring) 72 for right-side scan connecting wirings is further connected to the second right-side scan switching element $69_2$, the first right-side scan switching element $69_3$, the second right-side scan switching element $69_6$ and the first right-side scan switching element $69_7$. That is, the second inspection wiring 72 for right-side scan connecting wirings is an inspection wiring capable of inputting scan inspection signals to the non-adjacent first right-side scan switching elements $69_3$ and $69_7$ that are not connected to the first inspection wiring 70 for right-side scan connecting wirings among the first right-side scan switching elements $69_1$, $69_3$, $69_5$ and $69_7$, and to the non-adjacent second right-side scan switching elements $69_2$ and $69_6$ that are not connected to the first inspection wiring 70 for right-side scan connecting wirings among the second right-side scan switching elements $69_2$, $69_4$ and $69_6$. Note that the second inspection wiring 72 for right-side scan connecting wirings is formed in the peripheral wiring region 6 so as to intersect each of the right-side scan connecting wirings $61_1$ to $61_7$.

Also, a second inspection pad 73 for right-side scan connecting wirings is further connected to the second inspection wiring 72 for right-side scan connecting wirings. The second inspection pad 73 for right-side scan connecting wirings is a pad through which scan inspection signals can be input. Scan inspection signals can thereby be input to the second right-side scan connecting wiring $61_2$, the first right-side scan connecting wiring $61_3$, the second right-side scan connecting wiring $61_6$ and the first right-side scan connecting wiring $61_7$ from the second inspection pad 73 for right-side scan connecting wirings.

That is, because the first inspection wiring 70 for right-side scan connecting wirings, the first inspection pad 71 for right-side scan connecting wirings, the second inspection wiring 72 for right-side scan connecting wirings and the second inspection pad 73 for right-side scan connecting wirings are formed as described above in the peripheral wiring region 6, different scan inspection signals can be input to each of the adjacent first right-side scan connecting wirings $61_1$, $61_3$, $61_5$ and $61_7$. Short circuits between the adjacent first right-side scan connecting wirings $61_1$, $61_3$, $61_5$ and $61_7$ formed on the first layer can thereby be detected. Different scan inspection signals can also be input to each of the adjacent second right-side scan connecting wirings $61_2$, $61_4$ and $61_6$. Short circuits between the adjacent second right-side scan connecting wirings $61_2$, $61_4$ and $61_6$ formed on the second layer can thereby also be detected.

Also, left-side scan switching elements $74_1$ to $74_6$ respectively connected to the left-side scan connecting wirings $65_1$ to $65_6$ are formed in the peripheral wiring region 6. Specifically, the left-side scan switching elements $74_1$ to $74_6$ are formed in the peripheral wiring region 6 in proximity to the input ends $44_1$ to $44_6$ for scan signals. Here, the left-side scan switching elements $74_1$ to $74_6$ include first left-side scan switching elements (first switching elements, fourth switching elements) $74_1$, $74_3$ and $74_5$ respectively connected to the first left-side scan connecting wirings $65_1$, $65_3$ and $65_5$ and second left-side scan switching elements (second switching elements, sixth switching elements) $74_2$, $74_4$ and $74_6$ respectively connected to the second left-side scan connecting wirings $65_2$, $65_4$ and $65_6$.

Here, a first inspection wiring (first inspection wiring, fourth inspection wiring) 75 for left-side scan connecting wirings is further connected to the first left-side scan switching element $74_1$, the second left-side scan switching element $74_4$ and the first left-side scan switching element $74_5$. That is, the first inspection wiring 75 for left-side scan connecting wirings is an inspection wiring capable of inputting scan inspection signals to the non-adjacent first left-side scan switching element $74_1$ and $74_5$ among the first left-side scan switching elements $74_1$, $74_3$ and $74_5$, and to the non-adjacent second left-side scan switching element $74_4$ among the second left-side scan switching elements $74_2$, $74_4$ and $74_6$. Note that the first inspection wiring 75 for left-side scan connecting wirings is formed in the peripheral wiring region 6 so as to intersect each of the left-side scan connecting wirings $65_1$ to $65_6$.

Also, a first inspection pad 76 for left-side scan connecting wirings is further connected to the first inspection wiring 75 for left-side scan connecting wirings. The first inspection pad 76 for left-side scan connecting wirings is a pad through which scan inspection signals can be input. Scan inspection signals can thereby be input to the first left-side scan connecting wirings $65_1$, the second left-side scan connecting wirings $65_4$ and the first left-side scan connecting wirings $65_5$ from the first inspection pad 76 for left-side scan connecting wirings.

Also, a second inspection wiring (second inspection wiring, sixth inspection wiring) 77 for left-side scan connecting wirings is further connected to the second left-side scan switching element $74_2$, the first left-side scan switching element $74_3$ and the second left-side scan switching element $74_6$. That is, the second inspection wiring 77 for left-side scan connecting wirings is an inspection wiring capable of inputting scan inspection signals to the non-adjacent first left-side scan switching element $74_3$ that is not connected to the first inspection wiring 75 for left-side scan connecting wirings among the first left-side scan switching elements $74_1$, $74_3$ and $74_5$, and to the non-adjacent second left-side scan switching element $74_2$ and $74_6$ that are not connected to the first inspection wiring 75 for left-side scan connecting wirings among the second left-side scan switching elements $74_2$, $74_4$ and $74_6$. Note that the second inspection wiring 77 for left-side scan connecting wirings is formed in the peripheral wiring region 6 so as to intersect each of the left-side scan connecting wirings $65_1$ to $65_6$.

Also, a second inspection pad 78 for left-side scan connecting wirings is further connected to the second inspection wiring 77 for left-side scan connecting wirings. The second inspection pad 78 for left-side scan connecting wirings is a pad through which scan inspection signals can be input. Scan inspection signals can thereby be input to the second left-side scan connecting wiring $65_2$, the first left-side scan connecting wiring $65_3$ and the second left-side scan connecting wiring $65_6$ from the second inspection pad 78 for left-side scan connecting wirings.

That is, because the first inspection wiring 75 for left-side scan connecting wirings, the first inspection pad 76 for left-side scan connecting wirings, the second inspection wiring 77 for left-side scan connecting wirings and the second inspection pad 78 for left-side scan connecting wirings are formed as described above in the peripheral wiring region 6, different scan inspection signals can be input to each of the adjacent first left-side scan connecting wirings $65_1$, $65_3$ and $65_5$. Short circuits between the adjacent first left-side scan connecting wirings $65_1$, $65_3$ and $65_5$ formed on the first layer can thereby be detected. Also, different scan inspection signals can be input to each of the adjacent second left-side scan connecting wirings $65_2$, $65_4$ and $65_6$. Short circuits between the adjacent second left-side scan connecting wirings $65_2$, $65_4$ and $65_6$ formed on the second layer can thereby also be detected.

Here, the first inspection wiring 70 for right-side scan connecting wirings and the second inspection wiring 72 for right-side scan connecting wirings are formed, as described above, in the peripheral wiring region 6 so as to intersect each of the right-side scan connecting wirings $61_1$ to $61_7$. Also, the first inspection wiring 75 for left-side scan connecting wirings and the second inspection wiring 77 for left-side scan connecting wirings are formed, as described above, in the peripheral wiring region 6 so as to intersect each of the left-side scan connecting wirings $65_1$ to $65_6$. Because the right-side scan connecting wirings $61_1$ to $61_7$ and the left-side scan connecting wirings $65_1$ to $65_6$ both intersect the same number of inspection wirings, the load on the right-side scan connecting wirings $61_1$ to $61_7$ and the load on the left-side scan connecting wirings $65_1$ to $65_6$ are equal. The carrying potential of the first scan wirings $40_1$ to $40_7$ connected to the right-side scan connecting wirings $61_1$ to $61_7$ and the carrying potential of the second scan wirings $41_1$ to $41_6$ connected to the left-side scan connecting wirings $65_1$ to $65_6$ will thus be the same. Thus, in the case where the active matrix substrate 2 according to the present embodiment is incorporated in a display device, an image with uniform brightness will be displayed on the display screen of the display device.

Also, a storage capacitor main wiring 79 is formed in the peripheral wiring region 6 so as to be closer to the display region 4 than are the inspection wirings 70, 72, 75 and 77. The storage capacitor main wiring 79 is formed in the peripheral wiring region 6 along the second side $S_2$ and the third side $S_3$, so as to sandwich the display region 4 from the left and right. A storage capacitor wiring (not shown) formed in the display region 4 is connected to the storage capacitor main wiring 79. Also, an inspection pad 80 for storage capacitor wirings is further connected to the storage capacitor main wiring 79 via the terminal arrangement region 5. The inspection pad 80 for storage capacitor wirings is a pad through which storage capacitor inspection signals can be input. Storage capacitor inspection signals can thereby be input to the storage capacitor wirings from inspection pad 80 for storage capacitor wirings. Note that the storage capacitor inspection signals are inspection signals for detecting disconnection of the storage capacitor wirings and leakage to the scan wirings 40 and 41.

Incidentally, in the present embodiment, the right-side scan switching elements $69_1$ to $69_7$ are formed in the peripheral wiring region 6 in proximity to the input ends $43_1$ to $43_7$ for scan signals and the left-side scan switching elements $74_1$ to $74_6$ are formed in the peripheral wiring region 6 in proximity to the input ends $44_1$ to $44_6$ for scan signals, as discussed above. Here, let us hypothetically consider the case where, conversely, the right-side scan switching elements $69_1$ to $69_7$ are formed in the peripheral wiring region 6 in proximity to the terminal ends for scan signals (i.e., opposite end of first scan wirings $40_1$ to $40_7$), and the left-side scan switching elements $74_1$ to $74_6$ are formed in the peripheral wiring region 6 in proximity to the terminal ends for scan signals (i.e., one end of second scan wirings $41_1$ to $41_6$).

Figure 4:
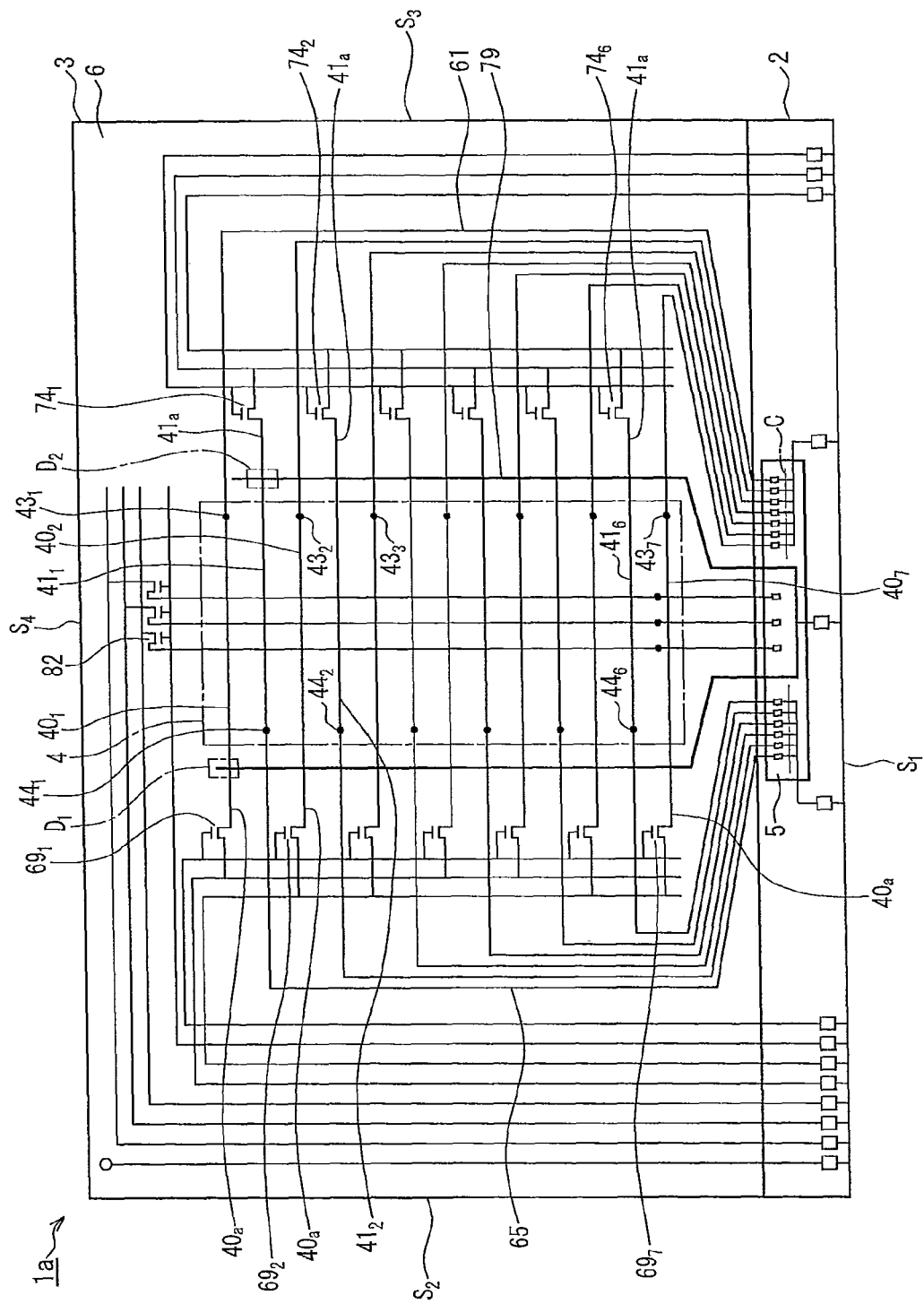
FIG. 4 is a plan view showing a schematic configuration of another liquid crystal panel according to the embodiment.

FIG. 4 is a plan view showing a schematic configuration of a liquid crystal panel 1a in the case where the right-side scan switching elements $69_1$ to $69_7$ and the left-side scan switching elements $74_1$ to $74_6$ are formed in the peripheral wiring region 6 close to the terminal ends for scan signals. Note that in FIG. 4, reference numerals are only attached to principal members, in order to simplify the description. As shown in FIG. 4, because the right-side scan switching elements $69_1$ to $69_7$ are formed in the peripheral wiring region 6 close to the terminal ends for scan signals, first extraction wirings 40a extracted from the opposite side of the first scan wirings $40_1$ to $40_7$ toward the second side $S_2$ are newly formed in the peripheral wiring region 6. That is, the first extraction wirings 40a connect the right-side scan switching elements $69_1$ to $69_7$ and the opposite ends of the first scan wirings $40_1$ to $40_7$. Also, because the left-side scan switching elements $74_1$ to $74_6$ are formed in the peripheral wiring region 6 close to the terminal ends for scan signals, second extraction wirings 41a extracted from the opposite side of the second scan wirings $41_1$ to $41_6$ toward the third side $S_3$ are newly formed in the peripheral wiring region 6. In other words, the second extraction wirings 41a connect the left-side scan switching elements $74_1$ to $74_6$ and the opposite ends of the second scan wirings $41_1$ to $41_6$.

That is, the storage capacitor main wiring 79 and the first extraction wirings 40a intersect in a portion $D_1$ shown in FIG. 4. Because the storage capacitor main wiring 79 and the first extraction wirings 40a intersect, a significant load is placed on the first scan wirings $40_1$ to $40_7$. Also, the storage capacitor main wiring 79 and the second extraction wirings 41a intersect in a portion $D_2$ shown in FIG. 4. Because the storage capacitor main wiring 79 and the second extraction wirings 41a intersect, a significant load is placed on the second scan wirings $41_1$ to $41_6$. In other words, because a significant load is placed on the scan wirings 40 and 41, scan signals input to the scan wirings 40 and 41 are delayed. Because the scan signals are delayed, it is difficult to charge data signals from the data wirings 42 in the storage capacitor. As a result, in the case where the liquid crystal panel 1a shown in FIG. 4 is incorporated in an electronic device, images that do not achieve the desired brightness, for example, are displayed on the display screen of the electronic device. In other words, the display quality of the liquid crystal panel 1a decreases.

In contrast, with the liquid crystal panel 1 according to the present embodiment, because the right-side scan switching elements $69_1$ to $69_7$ and the left-side scan switching elements $74_1$ to $74_6$ are formed in the peripheral wiring region 6 in proximity to the input ends for scan signals, as shown in FIG. 1, the above first extraction wirings 40a and second extraction wirings 41a need not be formed in the peripheral wiring region 6. There is thus no intersection between the storage capacitor main wiring 79 and first extraction wirings 40a or between the storage capacitor main wiring 79 and second extraction wirings 41a. As a result, problems such as discussed above do not occur with the liquid crystal panel 1 according to the present embodiment.

Also, with the liquid crystal panel 1a shown in FIG. 4, because the first extraction wirings 40a are newly formed in the peripheral wiring region 6, short circuits more readily occur between the first extraction wirings 40a and the left-side scan connecting wirings $65_1$ to $65_6$. Also, because the second extraction wirings 41a are newly formed in the peripheral wiring region 6, short circuits more readily occur between the second extraction wirings 41a and the right-side scan connecting wirings $61_1$ to $61_7$. Further, because the first extraction wirings 40a and the second extraction wirings 41a are newly formed in the peripheral wiring region 6, space for forming other wirings and switching elements in the peripheral wiring region 6 is reduced. Thus, short-circuit failures of the wirings and switching elements increase.

In contrast, with the liquid crystal panel 1 according to the present embodiment, because the right-side scan switching elements $69_1$ to $69_7$ and the left-side scan switching elements $74_1$ to $74_6$ are, as shown in FIG. 1, formed in the peripheral wiring region 6 in proximity to the input ends for scan signals, the above first extraction wirings 40a and second extraction wirings 41a need not be formed in the peripheral wiring region 6. As a result, problems such as discussed above do not occur with the liquid crystal panel 1 according to the present embodiment.

From the above, the mode in which the right-side scan switching elements $69_1$ to $69_7$ and the left-side scan switching elements $74_1$ to $74_6$ are formed in the peripheral wiring region 6 in proximity to the input ends for scan signals (see FIG. 1) is preferable to the mode in which the right-side scan switching elements $69_1$ to $69_7$ and the left-side scan switching elements $74_1$ to $74_6$ are formed in the peripheral wiring region 6 close to the terminal ends for scan signals (see FIG. 4). That is, the liquid crystal panel 1 shown in FIG. 1 increases yield as well as increasing display quality, in comparison with the liquid crystal panel 1a shown in FIG. 4.

Returning to FIG. 1, data connecting wirings (second connecting wirings) $81_1, 81_2, 81_3, \ldots 81_i$ respectively connecting the data terminals 52 and the input ends $45_1, 45_2, 45_3, \ldots 45_i$ for data signals provided at one end of the data wirings $42_1, 42_2, 42_3, \ldots 42_i$ are formed in the peripheral wiring region 6. That is, the data connecting wirings 81 are extracted from the input ends 45 for data signals toward the first side $S_1$, and connected to the data terminals 52. Note that in FIG. 1, the data connecting wirings $81_1, 81_2, 81_3, \ldots 81_i$ are represented simply as 81.

Also, switching elements (seventh switching elements) $82_1, 82_2, 82_3, \ldots 82_i$ for data wirings connected to the opposite ends of the data wirings $42_1, 42_2, 42_3, \ldots 42_i$ are formed in the peripheral wiring region 6. Note that in FIG. 1, the switching elements $82_1, 82_2, 82_3, \ldots 82_i$ for data wirings are represented simply as 82.

Here, a first inspection wiring (ninth inspection wiring) 83 for data wirings is further connected to the switching elements $82_1, 82_4, 82_7, \ldots 82_{i-2}$ for data wirings. That is, the first inspection wiring 83 for data wirings is an inspection wiring capable of inputting data inspection signals to the non-adjacent switching elements $82_1, 82_4, 82_7, \ldots 82_{i-2}$ for data wirings among the switching elements 82 for data wirings. Note that the first inspection wiring 83 for data wirings is formed in the peripheral wiring region 6 on the fourth side $S_4$ and the second side $S_2$. Also, a first inspection pad 84 for data wirings is further connected to the first inspection wiring 83 for data wirings. The first inspection pad 84 for data wirings is a pad through which data inspection signals can be input. Note that data inspection signals are inspection signals that functions as data signals. Data inspection signals can thereby be input to the data wirings $42_1, 42_4, 42_7, \ldots 42_{i-2}$ from the first inspection pad 84 for data wirings.

Also, a second inspection wiring (tenth inspection wiring) 85 for data wirings is further connected to the switching elements $82_2, 82_5, 82_8, \ldots 82_{i-1}$ for data wirings. That is, the second inspection wiring 85 for data wirings is an inspection wiring capable of inputting data inspection signals to the non-adjacent switching elements $82_2, 82_5, 82_8, \ldots 82_{i-1}$ for data wirings that are not connected to the first inspection wiring 83 for data wirings among the switching elements 82 for data wirings. Note that the second inspection wiring 85 for data wirings is formed in the peripheral wiring region 6 on the fourth side $S_4$ and the second side $S_2$, similarly to the first inspection wiring 83 for data wirings. Also, a second inspection pad 86 for data wirings is further connected to the second inspection wiring 85 for data wirings. The second inspection pad 86 for data wirings is a pad through which data inspection signals can be input. Data inspection signals can thereby be input to the data wirings $42_2, 42_5, 42_8, \ldots 42_{i-1}$ from the second inspection pad 86 for data wirings.

Further, a third inspection wiring (tenth inspection wiring) 87 for data wirings is further connected to the switching elements $82_3, 82_6, 82_9, \ldots 82_i$ for data wirings. That is, the third inspection wiring 87 for data wirings is an inspection wiring capable of inputting data inspection signals to the non-adjacent switching elements $82_3, 82_6, 82_9, \ldots 82_i$ for data wirings that are not connected to the first inspection wiring 83 for data wirings or the second inspection wiring 85 for data wirings among the switching elements 82 for data wirings. Note that the third inspection wiring 87 for data wirings is formed in the peripheral wiring region 6 on the fourth side $S_4$ and the second side $S_2$, similarly to the first inspection wiring 83 for data wirings and the second inspection wiring 85 for data wirings. A third inspection pad 88 for data wirings is further connected to the third inspection wiring 87 for data wirings. The third inspection pad 88 for data wirings is a pad through which data inspection signals can be input. Data inspection signals can thereby be input to the data wirings $42_3, 42_6, 42_9, \ldots 42_i$ from the third inspection pad 88 for data wirings.

That is, because the first inspection wiring 83 for data wirings, the first inspection pad 84 for data wirings, the second inspection wiring 85 for data wirings, the second inspection pad 86 for data wirings, the third inspection wiring 87 for data wirings and the third inspection pad 88 for data wirings are formed as described above in the peripheral wiring region 6, different data inspection signals can be input to each of the adjacent data wirings 42 and the adjacent data connecting wirings 81. Short circuits of the data wirings 42 and the data connecting wirings 81 can thereby be detected.

Further, a switching element control wiring (first control wiring, second control wiring) 89 connected to the right-side scan switching elements $69_1$ to $69_7$, the left-side scan switching elements $74_1$ to $74_6$ and the switching elements $82_1$, $82_2$, $82_3$, ... $82_i$ for data wirings is formed in the peripheral wiring region 6. The switching element control wiring 89 is formed closer to the display region 4 than are the first inspection wiring 70 for right-side scan connecting wirings, the second inspection wiring 72 for right-side scan connecting wirings, the first inspection wiring 75 for left-side scan connecting wirings and the second inspection wiring 77 for left-side scan connecting wirings. A control pad 90 is connected to the switching element control wiring 89. The control pad 90 is a pad through which control signals for turning switching elements on/off can be input. Control signals can thereby be input to the right-side scan switching elements $69_1$ to $69_7$, the left-side scan switching elements $74_1$ to $74_6$ and the switching elements $82_1$, $82_2$, $82_3$, ... $82_i$ for data wirings from the control pad 90.

Incidentally, in the present embodiment, as shown in FIG. 1, the first inspection wiring 70 for right-side scan connecting wirings and the second inspection wiring 72 for right-side scan connecting wirings are adjacent to each other, and all of the right-side scan switching elements $69_1$ to $69_7$ are formed between the first inspection wiring 70 for right-side scan connecting wirings and the second inspection wiring 72 for right-side scan connecting wirings. Also, the first inspection wiring 75 for left-side scan connecting wirings and the second inspection wiring 77 for left-side scan connecting wirings are adjacent to each other, and all of the left-side scan switching elements $74_1$ to $74_6$ are formed between the first inspection wiring 75 for left-side scan connecting wirings and the second inspection wiring 77 for left-side scan connecting wirings. This enables the number of connecting portions for electrically connecting wirings formed on the first layer and wirings formed on the second layer to be reduced, as will be discussed in detail below. In other words, when connecting portions are formed, wirings formed on the first layer and wirings formed on the second layer can lose electrical continuity due to faulty connecting portions or the like. Resistance is also increased by the connecting portions. Scanning wirings 40 and 41 cannot be correctly inspected in such cases. Further, the size of the active matrix substrate 2 increases, together with an increased likelihood of short circuits with adjacent wirings, since space for forming the connecting portions is needed. Thus, as few connecting portions as possible is preferable.

Figure 5:
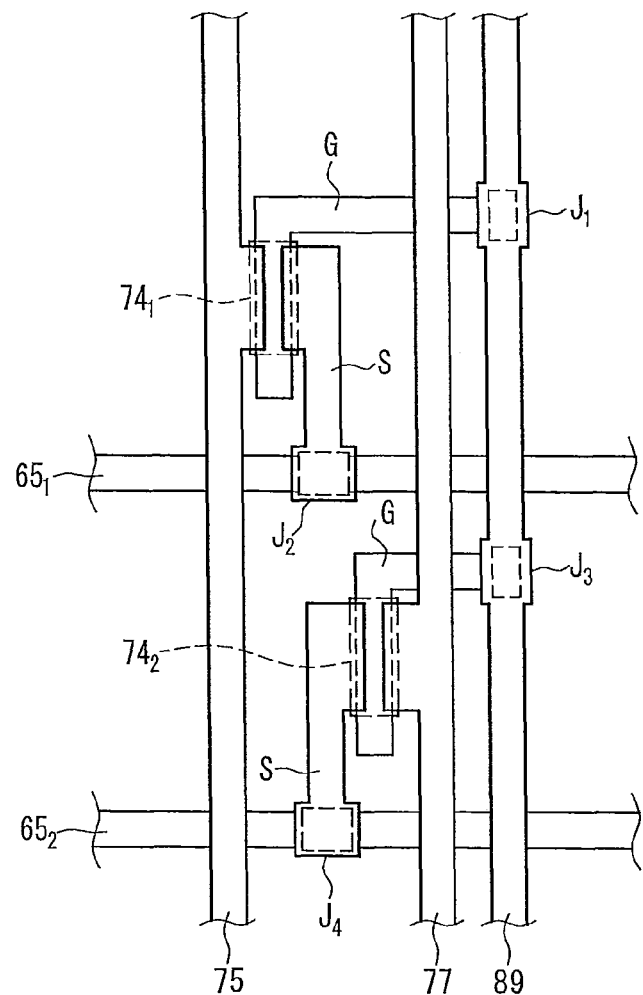
FIG. 5 is an illustrative diagram showing an enlarged view of an E portion shown in FIG. 1.

FIG. 5 is an illustrative diagram showing an enlarged view of an E portion shown in FIG. 1. Note that in FIG. 5, the insulating film 7 and the protective film 8 are omitted for ease of description. Here, a arrangement relationship of the first inspection wiring 75 for left-side scan connecting wirings, the second inspection wiring 77 for left-side scan connecting wirings, the switching element control wiring 89 and the left-side scan switching elements $74_1$ to $74_6$ will now be described, focusing on the location shown in FIG. 5. Note that because a arrangement relationship of the first inspection wiring 70 for right-side scan connecting wirings, the second inspection wiring 72 for right-side scan connecting wirings, the switching element control wiring 89 and the right-side scan switching elements $69_1$ to $69_7$ is similar to the aforementioned arrangement relationship, detailed description thereof will be omitted here.

In the present embodiment, the first inspection wiring 75 for left-side scan connecting wirings, the second inspection wiring 77 for left-side scan connecting wirings and the switching element control wiring 89 are formed on the second layer. The first left-side scan connecting wirings $65_1$, $65_3$ and $65_5$ are formed on the first layer. The second left-side scan connecting wirings $65_2$, $65_4$ and $65_6$ between the connecting portions $66_2$, $66_4$ and $66_6$ and the input ends $44_2$, $44_4$ and $44_6$ of the second scan wirings $41_2$, $41_4$ and $41_6$ are formed on the first layer. Further, gate electrodes G of the left-side scan switching elements $74_1$ to $74_6$ are formed on the first layer. Source electrodes S and drain electrodes D of the left-side scan switching elements $74_1$ to $74_6$ are formed on the second layer.

In such cases, as shown in FIG. 5, a connecting portion $J_1$ for electrically connecting the switching element control wiring 89 and the gate electrode G of the first left-side scan switching element $74_1$ will be required. A connecting portion $J_2$ for electrically connecting the left-side scan connecting wiring $65_1$ and the source electrode S of the first left-side scan switching element $74_1$ will also be required. Similarly, a connecting portion $J_3$ for electrically connecting the switching element control wiring 89 and the gate electrode G of the second left-side scan switching element $74_2$, and a connecting portion $J_4$ for electrically connecting the left-side scan connecting wiring $65_2$ and the source electrode S of the second left-side scan switching element $74_2$ will be required. That is, in the case of forming the first left-side scan switching element $74_1$ and the second left-side scan switching element $74_2$ in the peripheral wiring region 6, the four connecting portions $J_1$ to $J_4$ will be required as connecting elements for electrically connecting wirings formed on the first layer with wirings formed on the second layer.

Figure 6:
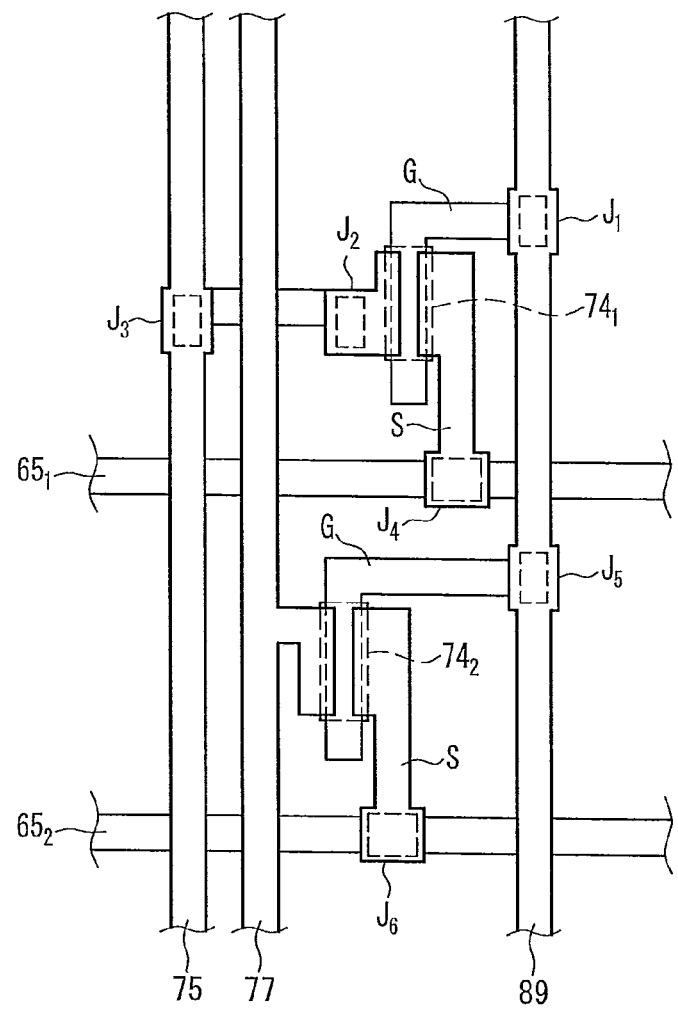
FIG. 6 is an illustrative diagram showing a portion of another active matrix substrate according to the embodiment at the same location as that shown in FIG. 5.
Figure 7:
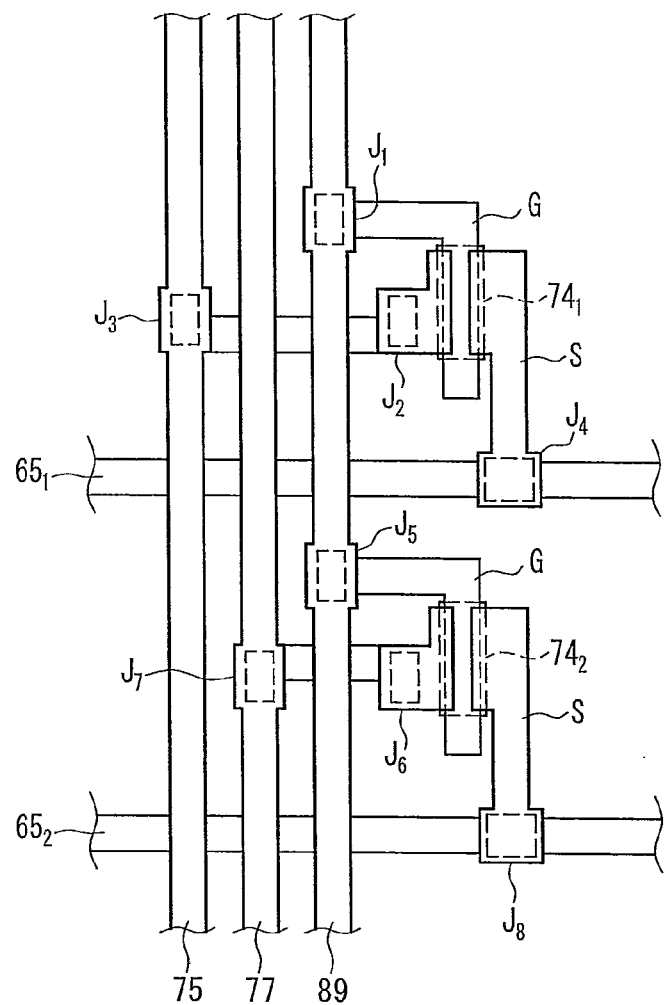
FIG. 7 is an illustrative diagram showing a portion of another active matrix substrate according to the embodiment at the same location as that shown in FIG. 5.

Here, let us hypothetically consider the case where all of the left-side scan switching elements $74_1$ to $74_6$ are formed between the second inspection wiring 77 for left-side scan connecting wirings and the switching element control wiring 89. In this case, there will be six connecting portions $J_1$ to $J_6$, as shown in FIG. 6. Again, let us hypothetically consider the case where all of the left-side scan switching elements $74_1$ to $74_6$ are formed closer to the display region 4 than are the first inspection wiring 75 for left-side scan connecting wirings, the second inspection wiring 77 for left-side scan connecting wirings and the switching element control wiring 89. In this case, there will be eight connecting portions $J_1$ to $J_8$, as shown in FIG. 7.

From the above, the number of connecting portions can, as shown in the present embodiment, be reduced in comparison with the above modes (FIGS. 6 and 7), by forming all of the right-side scan switching elements $69_1$ to $69_7$ between the first inspection wiring 70 for right-side scan connecting wirings and the second inspection wiring 72 for right-side scan connecting wirings, and forming all of the left-side scan switching elements $74_1$ to $74_6$ between the first inspection wiring 75 for left-side scan connecting wirings and the second inspection wiring 77 for left-side scan connecting wirings. As a result, the active matrix substrate 2 according to the present embodiment can be reduced in size as well as being able to contribute to improving the yield of the liquid crystal panel 1.

Figure 8:
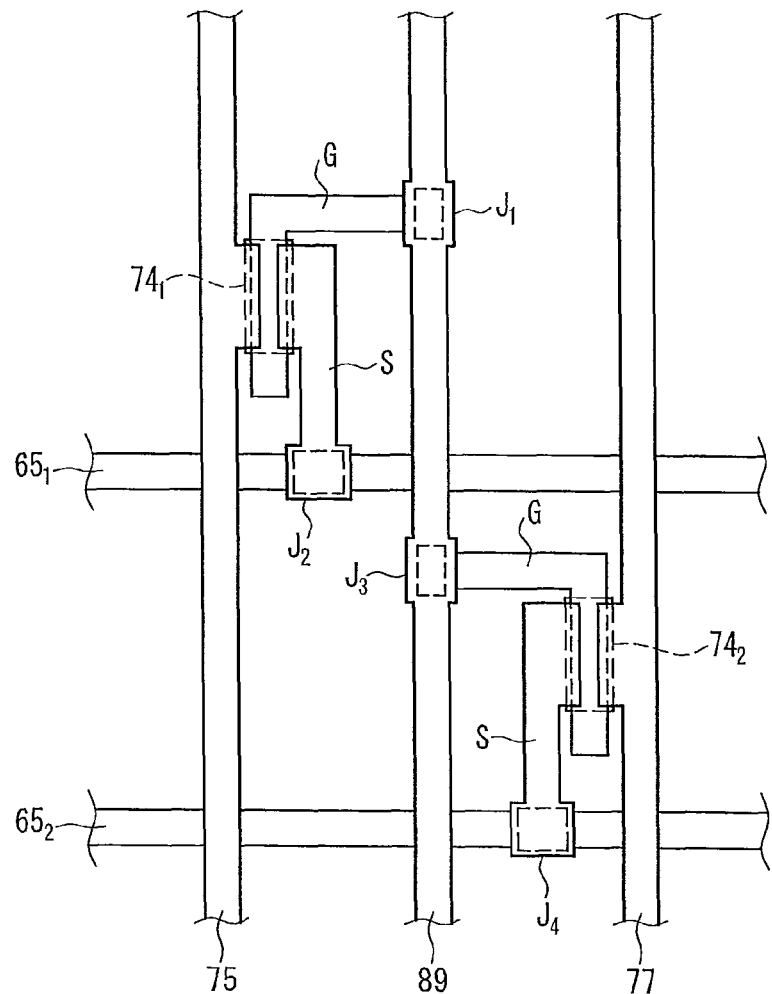
FIG. 8 is an illustrative diagram showing a portion of another active matrix substrate according to the embodiment at the same location as that shown in FIG. 5.

Note that the number of connecting portions can also be reduced, similarly to the case shown in FIG. 5, with a mode in which the left-side scan switching elements connected to the first inspection wiring 75 for left-side scan connecting wirings are formed between the first inspection wiring 75 for left-side scan connecting wirings and the switching element control wiring 89, and the left-side scan switching elements connected to the second inspection wiring 77 for left-side scan connecting wirings are formed between the second inspection wiring 77 for left-side scan connecting wirings and the switching element control wiring 89. That is, as shown in FIG. 8, the first left-side scan switching element 74₁ is formed on the left side of the switching element control wiring 89, and the second left-side scan switching element 74₂ is formed on the right side of the switching element control wiring 89. In this case, the four connecting portions J₁ to J₄ will be required, similarly to the case shown FIG. 5.

Figure 9:
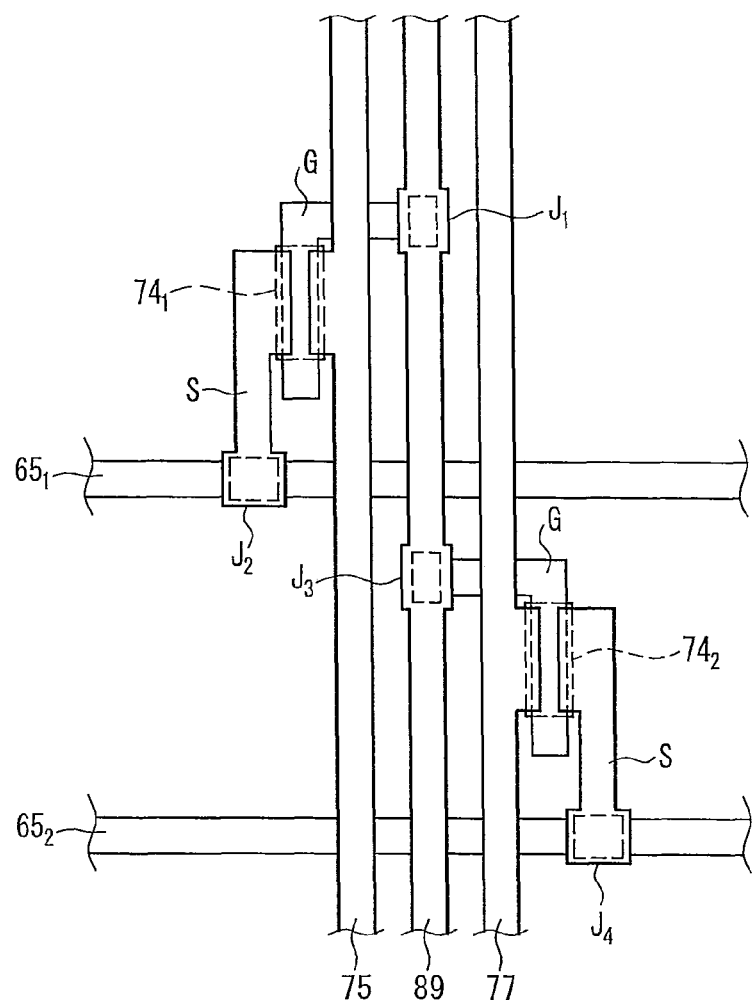
FIG. 9 is an illustrative diagram showing a portion of another active matrix substrate according to the embodiment at the same location as that shown in FIG. 5.

The number of connecting portions can also be reduced, similarly to the case shown in FIG. 5, with a mode in which the left-side scan switching elements connected to the first inspection wiring 75 for left-side scan connecting wirings are formed on the left side of the first inspection wiring 75 for left-side scan connecting wirings and the switching element control wiring 89, and the left-side scan switching elements connected to the second inspection wiring 77 for left-side scan connecting wirings are formed on the right side of the second inspection wiring 77 for left-side scan connecting wirings and the switching element control wiring 89. That is, as shown in FIG. 9, the first left-side scan switching element 74₁ is formed on the left side of the first inspection wiring 75 for left-side scan connecting wirings and the switching element control wiring 89, and the second left-side scan switching element 74₂ is formed on the right side of the second inspection wiring 77 for left-side scan connecting wirings and the switching element control wiring 89. In this case, the four connecting portions J₁ to J₄ will be required, similarly to the case shown FIG. 5.

Returning to FIG. 1, a common inspection wiring 91 is formed in the peripheral wiring region 6 on the second side S₂. A common electrode pad 92 is connected to the common inspection wiring 91. A transfer pad 93 is further connected to the common inspection wiring 91. The transfer pad 93 is connected to a common electrode (not shown) formed on the opposing substrate 3. A common voltage can thereby be applied to the common electrode formed on the opposing substrate 3 from the common electrode pad 92.

Next, a method for manufacturing the liquid crystal panel 1 according to the present embodiment will be described. Note that, hereinafter, an inspection process of inspecting the electrical connection state of the liquid crystal panel 1 will, in particular, be described in detail.

That is, thin films such as a conductive film, an insulating film, a protective film and an orientation film are laminated on a transparent glass substrate to manufacture a base substrate for active matrix substrates on which are formed a plurality of active matrix substrate regions to be cut out as active matrix substrates 2. Also, thin films such as a black matrix, color filters, a conductive film and an orientation film are laminated on a transparent glass substrate to manufacture a base substrate for opposing substrates on which are formed a plurality of opposing substrate regions to be cut out as opposing substrates 3. A sealant is applied to one of the two base substrates. The two base substrates are then adhered together after the sealant has been applied. The two base substrates adhered together are then sectioned as mother substrates from which a prescribed number of liquid crystal panels 1 having an active matrix substrate 2 and an opposing substrate 3 are formed. A liquid crystal material is injected into each of the liquid crystal panel 1 sectioned as mother substrates using a vacuum injection method, for example, through an inlet formed between the active matrix substrate 2 and the opposing substrate 3. Note that the liquid crystal material may be injected using a drop injection method rather than a vacuum injection method. In this case, neither the inlet nor a process of sealing the inlet portion is required. The liquid crystal panel 1 shown in FIG. 1 is a single liquid crystal panel that has been sectioned as a mother substrate and injected with a liquid crystal material. Accordingly, although illustration thereof has been omitted, other liquid crystal panels exist above, below and to the left and right of the liquid crystal panel 1 shown in FIG. 1.

An inspection process of inspecting the electrical connection state of the liquid crystal panel 1 is then performed, prior to attaching the driver in the terminal arrangement region 5. That is, the inspection process is for inspecting for disconnection or short circuit of wiring and for picture element defects in the active matrix substrate 2 of the liquid crystal panel 1. Also, the inspection process may be divided into a first inspection process and a second inspection process, as will be discussed in detail later.

As for the inspection method, in the first inspection process, an inspection probe is brought into contact with the first inspection pad 64 for scan wirings, the second inspection pad 68 for scan wirings, the inspection pad 80 for storage capacitor wirings, the first inspection pad 84 for data wirings, the second inspection pad 86 for data wirings, the third inspection pad 88 for data wirings, the control pad 90 and the common electrode pad 92, and a voltage is applied to the pads, for example. In the second inspection process, an inspection probe is brought into contact with the first inspection pad 71 for right-side scan connecting wirings, the second inspection pad 73 for right-side scan connecting wirings, the first inspection pad 76 for left-side scan connecting wirings, the second inspection pad 78 for left-side scan connecting wirings, the inspection pad 80 for storage capacitor wirings, the first inspection pad 84 for data wirings, the second inspection pad 86 for data wirings, the third inspection pad 88 for data wirings, the control pad 90 and the common electrode pad 92, and a voltage is applied to the pads, for example. Note that the order in which the inspection probe is brought into contact with the pads is not particularly limited here.

Scan inspection signals that function as scan signals are thereby input to the scan wirings 40 and 41. Here, the scan inspection signals are, for example, signals that switch on the switching element of each picture element for at least a fixed period. Also, data inspection signals that function as data signals are input to the data wirings 42. Here, the data inspection signals are, for example, signals that orient the liquid crystal in each picture element region in a prescribed direction. When the molecular orientation direction of liquid crystal is controlled as a result of a data signal being applied to each picture element electrode with the switching element of each picture element in an ON state, and the liquid crystal panel 1 is irradiated from the back surface thereof with irradiation means such as a backlight, for example, an image will be displayed on the display screen of the liquid crystal panel 1 corresponding to the display region 4 of the active matrix substrate 2 (hereinafter, "display screen of the liquid crystal panel 1"). Accordingly, inspection can be made for disconnection and short circuit of wiring in the active matrix substrate 2 of the liquid crystal panel 1 by an inspector visually inspecting the display screen of the liquid crystal panel 1. Note that an image recognition device may be used instead of or in addition to visual inspection by an inspector, or inspection may be performed using a detection device or the like that electrically detects disconnection or short circuit of wiring.

Here, the first inspection process will be discussed in detail.

Hereinafter, first, the method for detecting disconnection of the scan wirings 40 and 41, the right-side scan connecting wirings $61_1$ to $61_7$ and the left-side scan connecting wirings $65_1$ to $65_6$ will be described.

That is, a data inspection signal is input to the data wirings 42, and scan inspection signals are input to the scan wirings 40 and 41, the right-side scan connecting wirings $61_1$ to $61_7$ and the left-side scan connecting wirings $65_1$ to $65_6$ from the first inspection pad 64 for scan wirings and the second inspection pad 68 for scan wirings. In the case where the scan wirings 40 and 41 are disconnected, picture elements in lines corresponding to scan wirings 40 and 41 at and after the location of the disconnection will thus not be displayed on the display screen of the liquid crystal panel 1. Thus, the inspector is able to detect that the scan wirings 40 and 41 are disconnected.

Also, in the case where the right-side scan connecting wirings $61_1$ to $61_7$ are disconnected, all of the lines corresponding to the first scan wirings $40_1$ to $40_7$ connected to the disconnected right-side scan connecting wirings $61_1$ to $61_7$ will not be displayed on the display screen of the liquid crystal panel 1. Thus, the inspector is able to detect that the right-side scan connecting wirings $61_1$ to $61_7$ are disconnected. Further, in the case where the left-side scan connecting wirings $65_1$ to $65_6$ are disconnected, all of the lines corresponding to the second scan wirings $41_1$ to $41_6$ connected to the disconnected left-side scan connecting wirings $65_1$ to $65_6$ will not be displayed on the display screen of the liquid crystal panel 1. Thus, the inspector is able to detect that the left-side scan connecting wirings $65_1$ to $65_6$ are disconnected.

Next, the method for detecting a short circuit between the scan wirings 40 and 41 will be described.

That is, a scan inspection signal is input to the first scan wirings $40_1$ to $40_7$ from the first inspection pad 64 for scan wirings, without inputting a scan inspection signal to the second scan wirings $41_1$ to $41_6$. In the case where the first scan wirings $40_1$ to $40_7$ and the second scan wirings $41_1$ to $41_6$ are short circuited at this time, not only the lines corresponding to the first scan wirings $40_1$ to $40_7$ but also lines corresponding to the second scan wirings $41_1$ to $41_6$ will be displayed on the display screen of the liquid crystal panel 1. Thus, the inspector is able to detect that there is a short circuit between the first scan wirings $40_1$ to $40_7$ and the second scan wirings $41_1$ to $41_6$. Note that a scan inspection signal may be input to the second scan wirings $41_1$ to $41_6$ from the second inspection pad 68 for scan wirings, without inputting a scan inspection signal to the first scan wirings $40_1$ to $40_7$.

Incidentally, in the above, scan inspection signals are collectively input to the right-side scan connecting wirings $61_1$ to $61_7$ from the first inspection pad 64 for scan wirings That is, the same scan inspection signal is input to each of the adjacent first right-side scan connecting wirings $61_1$, $61_3$, $61_5$ and $61_7$ formed on the first layer. In other words, the adjacent first right-side scan connecting wirings $61_1$, $61_3$, $61_5$ and $61_7$ have the same potential. Also, the same scan inspection signal is input to each of the adjacent second right-side scan connecting wirings $61_2$, $61_4$ and $61_6$ formed on the second layer. In other words, the adjacent second right-side scan connecting wirings $61_2$, $61_4$ and $61_6$ have the same potential. In the above first inspection process, short circuits between the adjacent first right-side scan connecting wirings $61_1$, $61_3$, $61_5$ and $61_7$ formed on the first layer and short circuits between the adjacent second right-side scan connecting wirings $61_2$, $61_4$ and $61_6$ formed on the second layer thus cannot be detected. Thus, inspection for the presence of these short circuits is made in the second inspection process, which will be discussed later.

Similarly, in the above first inspection process, short circuits between adjacent first left-side scan connecting wirings $65_1$, $65_3$ and $65_5$ formed on the first layer and short circuits between the second left-side scan connecting wirings $65_2$, $65_4$ and $65_6$ formed on the second layer cannot be detected. Thus, inspection for the presence of these short circuits is made in the second inspection process, which will be discussed later.

Next, the method for detecting disconnection of the data wirings 42 will be described.

That is, scan inspection signals are input to the scan wirings 40 and 41, and data inspection signals are input to the data wirings 42 from the first inspection pad 84 for data wirings, the second inspection pad 86 for data wirings and the third inspection pad 88 for data wirings. In the case where data wirings 42 are disconnected, picture elements in lines corresponding to data wirings 42 at and after the location of the disconnection are displayed differently to picture elements in normal lines. Thus, the inspector is able to detect that data wirings 42 are disconnected.

Next, the method for detecting a short circuit between the data wirings 42 and the data connecting wirings 81 will be described.

That is, a control signal for turning on the switching elements 82 for data wirings is input to the switching elements 82 for data wirings from the control pad 90. The switching elements 82 for data wirings are thereby turned on. Here, a data inspection signal is, for example, input to only the data wirings $42_1$, $42_4$, $42_7$, ... $42_{i-2}$ among the plurality of data wirings 42, and a data inspection signal is not input to the data wirings $42_2$, $42_3$, $42_5$, ... $42_{i-1}$, $42_i$ other than the data wirings $42_1$, $42_4$, $42_7$, ... $42_{i-2}$. The inspection probe is, for example, brought into contact with only the first inspection pad 84 for data wirings, and is not brought into contact with the second inspection pad 86 for data wirings or the third inspection pad 88 for data wirings.

In the case where the data wirings $42_1$, $42_4$, $42_7$, ... $42_{i-2}$ are short circuited, this results in not only the lines corresponding to the data wirings $42_1$, $42_4$, $42_7$, ... $42_{i-2}$ but also lines corresponding to short-circuited data wirings also being displayed. Thus, the inspector is able to detect that the data wirings $42_1$, $42_4$, $42_7$, ... $42_{i-2}$ are short circuited. Also, in the case where the data connecting wirings $81_1$, $81_4$, $81_7$, ... $81_{i-2}$ are short circuited, not only the lines corresponding to the data wirings $42_1$, $42_4$, $42_7$, ... $42_{i-2}$ connected to the data connecting wirings $81_1$, $81_4$, $81_7$, ... $81_{i-2}$ but also lines corresponding to data wirings connected to short-circuited connecting wirings will also be displayed. Thus, the inspector is able to detect that the data connecting wirings $81_1$, $81_4$, $81_7$, ... $81_{i-2}$ are short circuited.

Similarly, when the inspection probe is brought into contact with only the second inspection pad 86 for data wirings, and is not brought into contact with the first inspection pad 84 for data wirings or the third inspection pad 88 for data wirings, the inspector is able to detect a short circuit of the data wirings $42_2$, $42_5$, $42_8$, ... $42_{i-1}$ and the data connecting wirings $81_2$, $81_5$, $81_8$, ... $81_{i-1}$. Also, when the inspection probe is brought into contact with only the third inspection pad 88 for data wirings, and is not brought into contact with the first inspection pad 84 for data wirings or the second inspection pad 86 for data wirings, the inspector is able to detect a short circuit of the data wirings $42_3$, $42_6$, $42_9$, ... $42_i$ and the data connecting wirings $81_3$, $81_6$, $81_9$, ... $81_i$.

As described above, in the first inspection process, short circuits of the right-side scan connecting wirings $61_1$ to $61_7$ and the left-side scan connecting wirings $65_1$ to $65_6$ thus cannot be detected. In order to inspect for the presence of short circuits of the right-side scan connecting wirings $61_1$ to $61_7$ and the left-side scan connecting wirings $65_1$ to $65_6$, the second inspection process is subsequently performed.

Here, a cutting off process of cutting off the first extension wirings 53 and the second extension wirings 54 is performed before the second inspection process. Specifically, the first extension wirings 53 and the second extension wirings 54 are cut off along a cut line C shown in FIG. 1, for example. As for the cutting off method, cutting off is performed using a laser. The scan terminals 51 connected to the right-side scan connecting wirings $61_1$ to $61_7$ are thereby electrically cut off from each other. The scan terminals 51 connected to the left-side scan connecting wirings $65_1$ to $65_6$ are also electrically cut off from each other. Note that cutting off may be performed along another cutline instead of the cutline C, provided the plurality of scan terminals 51 are electrically cut off from each other.

Next, the second inspection process will be discussed in detail.

Hereinafter, the method for detecting short circuits of the right-side scan connecting wirings $61_1$ to $61_7$ and the left-side scan connecting wirings $65_1$ to $65_6$ will be described. Note that since the method for detecting short circuits of the scan wirings 40 and 41, the method for detecting disconnection of the data wirings 42 and the method for detecting short circuits of the data connecting wirings 81 are similar to the methods described in relation to the first inspection process, detailed description thereof will be omitted here. Also, the method for detecting disconnection of the scan wirings 40 and 41 can be implemented similarly to the first inspection process by using the first inspection pad 71 for right-side scan connecting wirings, the second inspection pad 73 for right-side scan connecting wirings, the first inspection pad 76 for left-side scan connecting wirings and the second inspection pad 78 for left-side scan connecting wirings, instead of the first inspection pad 64 for scan wirings and the second inspection pad 68 for scan wirings used in the first inspection process.

That is, a control signal for turning on the right-side scan switching elements $69_1$ to $69_7$ is input to the right-side scan switching elements $69_1$ to $69_7$ from the control pad 90. The right-side scan switching elements $69_1$ to $69_7$ are thereby turned on. Here, for example, a scan inspection signal is input to only the first right-side scan connecting wirings $61_1$ and $61_5$ among the first right-side scan connecting wirings $61_1$, $61_3$, $61_5$ and $61_7$, and a scan inspection signal is not input to the first right-side scan connecting wirings $61_3$ and $61_7$ other than the first right-side scan connecting wirings $61_1$ and $61_5$. Also, a scan inspection signal is input to only the second right-side scan connecting wiring $61_4$ among the second right-side scan connecting wirings $61_2$, $61_4$ and $61_6$, and a scan inspection signal is not input to the second right-side scan connecting wirings $61_2$ and $61_6$ other than the second right-side scan connecting wirings $61_4$. The inspection probe is, for example, brought into contact with only the first inspection pad 71 for right-side scan connecting wirings, and is not brought into contact with the second inspection pad 73 for right-side scan connecting wirings.

In the case where the first right-side scan connecting wirings $61_1$ and $61_5$ formed on the first layer are short circuited, this results in not only the lines corresponding to the first scan wirings $40_1$ and $40_5$ connected to the first right-side scan connecting wirings $61_1$ and $61_5$ but also lines corresponding to first scan wirings connected to short-circuited first right-side scan connecting wirings being displayed. Thus, the inspector is able to detect that the first right-side scan connecting wirings $61_1$ and $61_5$ formed on the first layer are short circuited. Also, in the case where the second right-side scan connecting wiring $61_4$ formed on the second layer is short circuited, not only the line corresponding to the first scan wiring $40_4$ connected to the second right-side scan connecting wiring $61_4$ but also lines corresponding to first scan wirings connected to short-circuited second right-side scan connecting wirings will be displayed. Thus, the inspector is able to detect that the second right-side scan connecting wiring $61_4$ formed on the second layer is short circuited.

Similarly, for example, when the inspection probe is brought into contact with only the second inspection pad 73 for right-side scan connecting wirings, and is not brought into with the first inspection pad 71 for right-side scan connecting wirings, the inspector is able to detect a short circuit of the first right-side scan connecting wirings $61_3$ and $61_7$ formed on the first layer, and a short circuit of the second right-side scan connecting wirings $61_2$ an $61_6$ formed on the second layer.

Also, a control signal for turning on the left-side scan switching elements $74_1$ to $74_6$ is input to the left-side scan switching elements $74_1$ to $74_6$ from the control pad 90. The left-side scan switching elements $74_1$ to $74_6$ are thereby turned on. Here, for example, a scan inspection signal is input to only the first left-side scan switching elements $74_1$ and $74_5$ among the first left-side scan switching elements $74_1$, $74_3$ and $74_5$, and a scan inspection signal is not input to the first left-side scan switching element $74_3$ other than the first left-side scan switching elements $74_1$ and $74_5$. Also, a scan inspection signal is input to only the second left-side scan switching element $74_4$ among the second left-side scan switching elements $74_2$, $74_4$ and $74_6$, and a scan inspection signal is not input to the second left-side scan switching elements $74_2$ and $74_6$ other than the second left-side scan switching elements $74_4$. The inspection probe is, for example, brought into contact with only the first inspection pad 76 for left-side scan connecting wirings, and is not brought into contact with the second inspection pad 78 for left-side scan connecting wirings.

In the case where the first left-side scan connecting wirings $65_1$ and $65_5$ formed on the first layer are short circuited, not only the lines corresponding to the second scan wirings $41_1$ and $41_5$ connected to the first left-side scan connecting wirings $65_1$ and $65_5$ but also lines corresponding to second scan wirings connected to short-circuited first left-side scan connecting wirings will be displayed. Thus, the inspector is able to detect that the first left-side scan connecting wirings $65_1$ and $65_5$ formed on the first layer are short circuited. Also, in the case where the second left-side scan connecting wirings $65_4$ formed on the second layer is short circuited, not only the line corresponding to the second scan wiring $41_4$ connected to the second left-side scan connecting wirings $65_4$ but also lines corresponding to second scan wirings connected to short-circuited second left-side scan connecting wirings will be displayed. Thus, the inspector is able to detect that the second left-side scan connecting wiring $65_4$ formed on the second layer is short circuited.

Similarly, for example, when the inspection probe is brought into contact with only the second inspection pad 78 for left-side scan connecting wirings, and is not brought into contact with the first inspection pad 76 for left-side scan connecting wirings, the inspector is able to detect a short circuit of the first left-side scan connecting wiring $65_3$ formed on the first layer and a short circuit of the second left-side scan connecting wirings $65_2$ and $65_6$ formed on the second layer.

Incidentally, when the first extension wirings 53 and the second extension wirings 54 are cut off in the cutting off process, part of the extension wirings 53 and 54 may remain without being removed. The scan terminals 51 and extension wirings 53 and 54 may also be short circuited by cut-off scraps being sprayed into the terminal arrangement region 5. It is thus preferable to inspect whether the scan terminals 51 connected to the right-side scan connecting wirings $61_1$ to $61_7$ and the left-side scan connecting wirings $65_1$ to $65_6$ are electrically cut off from each other. That is, scan inspection signals are input to the right-side scan connecting wirings $61_1$ to $61_7$ and the left-side scan connecting wirings $65_1$ to $65_6$ from the first inspection pad 64 for scan wirings and the second inspection pad 68 for scan wirings. Accordingly, when part of the first extension wirings 53 and the second extension wirings 54 remains without being removed or when the scan terminals 51 and the extension wirings 53 and 54 are short circuited, an image will be displayed on display screen of the liquid crystal panel 1. Hence, defects that occur in the cutting off process can be detected.

When disconnection or short circuit of wiring is detected in the first inspection process or the second inspection process, the liquid crystal panel 1 in which the disconnection or short circuit of wiring was detected is removed as defective. Since it is no longer necessary to mount drivers to defective liquid crystal panels 1, yield in the driver mounting process can thereby improved, and cost reduction can be achieved. Note that instead of removing liquid crystal panels 1 in which disconnection or short circuit of wiring is detected, the disconnection or short circuit may be repaired by irradiating a laser or the like on the place where the disconnection or short circuit has occurred.

Next, a mounting process is performed after the above inspection process (first inspection process, second inspection process). The mounting process is a process of mounting a driver for driving and controlling the scan wirings 40 and 41 and the data wirings 42 in the terminal arrangement region 5 of the active matrix substrate 2, for example. The individual liquid crystal panels 1 are then cut out from the mother board. An optical film such as a polarizer is adhered to the cut out liquid crystal panels 1. Liquid crystal panels 1 are thereby manufactured. Note that the method for manufacturing the liquid crystal panels 1 is not intended to be limited to the above method. For example, with a monochrome liquid crystal panel, color filters need not be laminated on the opposing substrate. Also, the inspection process and the mounting process may be performed after the individual liquid crystal panels have been cut out.

As discussed above, according to the active matrix substrate 2 in the present embodiment, an active matrix substrate that enables short circuits between adjacent connecting wirings formed on the same layer (first right-side scan connecting wirings, second right-side scan connecting wirings, first left-side scan connecting wirings, second left-side scan connecting wirings) to be reliably detected with a simple configuration can be realized.

Note that in the present embodiment, an active matrix substrate on which first scan wirings and second scan wirings are formed in a display region alternately per wiring and so as to be parallel to each other was described, but the present invention is not limited thereto. For example, the present invention can, naturally, be applied to an active matrix substrate on which are formed a first group of scan wirings adjacent to each other and each having an input end for scan signals at one end and a second group of scan wirings adjacent to each other and each having an input end for scan signals at the opposite end are formed in a display region (e.g., active matrix substrate disclosed in WO 2008/015808A described in the Background Art). In such an active matrix substrate, the right-side scan connecting wirings respectively connect the scan terminals and the input ends of the first group of scan wirings, and the left-side scan connecting wirings respectively connect the scan terminals and the input ends of the second scan wirings. Also, for example, the present invention can, naturally, also be applied in an active matrix substrate on which only scan wirings each having an input end for scan signals at one end are formed as the scan wirings, or to an active matrix substrate on which only scan wirings each having an input end for scan signals at the opposite end are formed as the scan wirings.

Also, in the present embodiment, an example was described in which common electrodes are formed on the opposing substrate and a common voltage is applied to the common electrodes on the opposing substrate, but the present invention is not limited thereto. For example, the present invention can, naturally, also be applied to an IPS (In-Plane Switching) mode liquid crystal panel in which common electrodes are formed on an active matrix substrate. Here, a transfer pad need not be formed on the active matrix substrate of an IPS mode liquid crystal panel. The present invention can, naturally, also be applied to an MVA (Multi-Domain Vertical Aligned) mode liquid crystal panel, an OCB (Optically Compensated Bend) mode liquid crystal panel, or the like.

Also, in the present embodiment, an example of a Cs-on-Common type liquid crystal panel in which independent storage capacitor wirings are formed in the display region and a storage capacitor is formed using these storage capacitor wirings was described, but the present invention is not limited thereto. That is, the present invention can, naturally, also be applied to a Cs-on-Gate type liquid crystal panel in which a storage capacitor is formed using adjacent scan wirings. Here, with a Cs-on-Gate type liquid crystal panel, independent storage capacitor wirings do not need to be formed in the display region. A Cs-on-Gate type liquid crystal panel is thus able to realize a high aperture ratio.

Also, in the present embodiment, an example was described in which R data wirings, G data wirings and B data wirings are formed in the display region, but the present invention is not limited thereto. That is, R scan wirings, G scan wirings and B scan wirings may be formed in the display region. In this case, data wirings do not need to be provided per RGB.

Also, in the present embodiment, an example was described in which a common switching element control wiring for each of the right-side scan switching elements, the left-side scan switching elements and the switching elements for data wirings is formed in the peripheral wiring region, but the present invention is not limited thereto. For example, individual switching element control wirings for each of the right-side scan switching elements, the left-side scan switching elements and the switching elements for data wirings may be formed in the peripheral wiring region.

Also, in the present embodiment, an example was described in which inspection pads formed on an active matrix substrate are not connected to inspection pads formed on another active matrix substrate, but the present invention is not limited thereto. That is, inspection pads formed on an active matrix substrate may be connected to inspection pads formed on another active matrix substrate. In particular, if the first inspection pad for scan wirings and the second inspection pad for scan wirings are connected to inspection pads formed on another active matrix substrate, the effect of eliminating or dispersing static electricity generated on an active matrix substrate is enhanced.

Further, in the present embodiment, an example was described in which the inspection pads are formed on the active matrix substrate, but the present invention is not limited thereto. For example, a configuration may be adopted in which the inspection pads are formed on a different substrate from the active matrix substrate, and only inspection wirings to which inspection signals supplied from the inspection pads can be input are formed on the active matrix substrate.

That is, the present invention is not intended to be limited to the abovementioned embodiment and various modifications are possible within the scope defined by the claims. That is, embodiments combining technical means appropriately modified within the scope defined by the claims are encompassed in the technical scope of the present invention.

INDUSTRIAL APPLICABILITY

As described above, the present invention is industrially applicable as an active matrix substrate, a display device, a method for inspecting an active matrix substrate, and a method for inspecting a display device that enable short circuits between adjacent connecting wirings formed on the same layer to be reliably detected with a simple configuration in relation to each of a plurality of layers.

The invention claimed is:

1. An active matrix substrate comprising:
a plurality of first wirings formed parallel to each other in a display region;
a plurality of second wirings formed parallel to each other and so as to intersect the plurality of first wirings in the display region;
a plurality of first terminals and a plurality of second terminals arranged in a terminal arrangement region;
a plurality of first connecting wirings respectively connecting the plurality of first wirings and the plurality of first terminals; and
a plurality of second connecting wirings respectively connecting the plurality of second wirings and the plurality of second terminals,
wherein the plurality of first connecting wirings include a plurality of third connecting wirings and a plurality of fourth connecting wirings, the third connecting wirings being formed on a same layer as a layer on which the first wirings are formed, and at least a portion of the fourth wirings being formed on a different layer from the layer on which the first wirings are formed with an insulating material sandwiched therebetween, and
the active matrix substrate comprises:
a plurality of first switching elements respectively having a gate electrode, a source electrode and a drain electrode, each of the source electrode of the plurality of first switching elements being connected to one of the plurality of third connecting wirings;
a plurality of second switching elements respectively having a gate electrode, a source electrode and a drain electrode, each of the source electrode of the plurality of second switching elements being connected to one of the plurality of fourth connecting wirings;
a first common wiring connected
to the drain electrodes of the first switching elements that are not adjacent to each other among the plurality of first switching elements, and
to the drain electrodes of the second switching elements that are not adjacent to each other among the plurality of second switching elements; and
a second common wiring connected
to the drain electrodes of the first switching elements that are not adjacent to each other and not connected to the first common wiring among the plurality of first switching elements, and
to the drain electrodes of the second switching elements that are not adjacent to each other and not connected to the first common wiring among the plurality of second switching elements.

2. The active matrix substrate according to claim 1,
wherein the plurality of first wirings include a plurality of third wirings each having a signal input end at one end and a plurality of fourth wirings each having a signal input end at an opposite end, the third wirings and the fourth wirings being formed alternately in the display region,
the plurality of third connecting wirings include a plurality of fifth connecting wirings respectively connecting the plurality of first terminals and the input ends of third wirings that are not adjacent to each other among the plurality of third wirings and a plurality of sixth connecting wirings respectively connecting the plurality of first terminals and the input ends of fourth wirings that are not adjacent to each other among the plurality of fourth wirings,
the plurality of fourth connecting wirings include a plurality of seventh connecting wirings respectively connecting the plurality of first terminals and the input ends of third wirings that are not adjacent to each other and not connected to the fifth connecting wirings among the plurality of third wirings and a plurality of eighth connecting wirings respectively connecting the plurality of first terminals and the input ends of fourth wirings that are not adjacent to each other and not connected to the sixth connecting wirings among the plurality of fourth wirings,
the first switching elements include a plurality of third switching elements respectively connected to the plurality of fifth connecting wirings and a plurality of fourth switching elements respectively connected to the plurality of sixth connecting wirings,
the second switching elements include a plurality of fifth switching elements respectively connected to the plurality of seventh connecting wirings and a plurality of sixth switching elements respectively connected to the plurality of eighth connecting wirings,
the first common wiring includes:
a third common wiring connected to third switching elements that are not adjacent to each other among the plurality of third switching elements and to fifth switching elements that are not adjacent to each other among the plurality of fifth switching elements, and
a fourth common wiring connected to fourth switching elements that are not adjacent to each other among the plurality of fourth switching elements and to sixth switching elements that are not adjacent to each other among the plurality of sixth switching elements, and
the second common wiring includes:
a fifth common wiring connected to third switching elements that are not adjacent to each other and not connected to the third common wiring among the plurality of third switching elements and to fifth switching elements that are not adjacent to each other and not connected to the third common wiring among the plurality of fifth switching elements, and
a sixth common wiring connected to fourth switching elements that are not adjacent to each other and not connected to the fourth common wiring among the plurality of fourth switching elements and to sixth switching elements that are not adjacent to each other and not connected to the fourth common wiring among the plurality of sixth switching elements.

3. The active matrix substrate according to claim 2,
wherein the plurality of third switching elements and the plurality of fifth switching elements are formed in a peripheral wiring region in proximity to the input ends of the third wirings, and
the plurality of fourth switching elements and the plurality of sixth switching elements are formed in the peripheral wiring region in proximity to the input ends of the fourth wirings.

4. The active matrix substrate according to claim 2,
wherein the third common wiring is formed in the peripheral wiring region so as to intersect each of the plurality of fifth connecting wirings and each of the plurality of seventh connecting wirings,
the fifth common wiring is formed in the peripheral wiring region so as to intersect each of the plurality of fifth connecting wirings and each of the plurality of seventh connecting wirings,
the fourth common wiring is formed in the peripheral wiring region so as to intersect each of the plurality of sixth connecting wirings and each of the plurality of eighth connecting wirings, and
the sixth common wiring is formed in the peripheral wiring region so as to intersect each of the plurality of sixth connecting wirings and each of the plurality of eighth connecting wirings.

5. The active matrix substrate according to claim 2,
wherein the third common wiring and the fifth common wiring are adjacent to each other,
the fourth common wiring and the sixth common wiring are adjacent to each other,
at least one of the plurality of third switching elements is formed between the third common wiring and the fifth common wiring,
at least one of the plurality of fifth switching elements is formed between the third common wiring and the fifth common wiring,
at least one of the plurality of fourth switching elements is formed between the fourth common wiring and the sixth common wiring, and
at least one of the plurality of sixth switching elements is formed between the fourth common wiring and the sixth common wiring.

6. The active matrix substrate according to claim 5,
wherein all of the plurality of third switching elements are formed between the third common wiring and the fifth common wiring,
all of the plurality of fifth switching elements are formed between the third common wiring and the fifth common wiring,
all of the plurality of fourth switching elements are formed between the fourth common wiring and the sixth common wiring, and
all of the plurality of sixth switching elements are formed between the fourth common wiring and the sixth common wiring.

7. The active matrix substrate according to claim 2,
wherein a first gate common wiring connected to the gate electrode of each third switching element and each fifth switching element is formed between the third common wiring and the fifth common wiring,
the third switching elements are formed on either side, sandwiching the first gate common wiring,
the fifth switching elements are formed on either side, sandwiching the first gate common wiring,
a second gate common wiring connected to the gate electrode of each fourth switching element and each sixth switching element is formed between the fourth common wiring and the sixth common wiring,
the fourth switching elements are formed on either side, sandwiching the second gate common wiring, and
the sixth switching elements are formed on either side, sandwiching the second gate common wiring.

8. The active matrix substrate according to claim 2, further comprising:
a plurality of first extension wirings individually extending from the plurality of first terminals respectively connected to the plurality of fifth connecting wirings and the plurality of first terminals respectively connected to the plurality of seventh connecting wirings;
a seventh common wiring connected to each of the plurality of first extension wirings;
a plurality of second extension wirings individually extending from the plurality of first terminals respectively connected to the plurality of sixth connecting wirings and the plurality of first terminals respectively connected to the plurality of eight connecting wirings; and
an eighth common wiring connected to each of the plurality of second extension wirings.

9. The active matrix substrate according to claim 8,
wherein the plurality of second wirings each have a signal input end at one end, and
the active matrix substrate further comprises:
a plurality of seventh switching elements connected to an opposite end of the second wirings,
a ninth common wiring connected to seventh switching elements that are not adjacent to each other among the plurality of seventh switching elements, and
a tenth common wiring connected to seventh switching elements that are not adjacent to each other and not connected to the ninth common wiring among the plurality of seventh switching elements.

10. The active matrix substrate according to claim 1,
wherein the plurality of first wirings include a first group of first wirings adjacent to each other and each having a signal input end at one end, and a second group of first wirings adjacent to each other and each having a signal input end at an opposite end, and
the plurality of first connecting wirings respectively connect the plurality of first terminals and the input ends of the first group of first wirings and respectively connect the plurality of first terminals and the input ends of the second group of first wirings.

11. The active matrix substrate according to claim 1, wherein the first wirings are scan wirings and the second wirings are data wirings.

12. A display device comprising an active matrix substrate according to claim 1.

13. The display device according to claim 12, wherein the display device is a liquid crystal display device.

* * * * *